US008808856B2

(12) United States Patent
Haba

(10) Patent No.: US 8,808,856 B2
(45) Date of Patent: Aug. 19, 2014

(54) APPARATUS AND METHOD FOR PRODUCING CARBON FILM USING PLASMA CVD AND CARBON FILM

(75) Inventor: Masanori Haba, Machida (JP)

(73) Assignee: Pureron Japan Co., Ltd., Fukushima (JP)

( * ) Notice: Subject to any disclaimer, the term of this patent is extended or adjusted under 35 U.S.C. 154(b) by 1397 days.

(21) Appl. No.: 10/558,874

(22) PCT Filed: Oct. 13, 2005

(86) PCT No.: PCT/JP2005/018894
§ 371 (c)(1),
(2), (4) Date: Jan. 3, 2007

(87) PCT Pub. No.: WO2006/073017
PCT Pub. Date: Jul. 13, 2006

(65) Prior Publication Data
US 2007/0104867 A1    May 10, 2007

(51) Int. Cl.
*B32B 9/00*    (2006.01)
(52) U.S. Cl.
USPC .......................................... 428/408; 423/448
(58) Field of Classification Search
USPC ............. 428/408; 423/447.1, 445 B; 977/742
See application file for complete search history.

(56) References Cited

U.S. PATENT DOCUMENTS

| | | | |
|---|---|---|---|
| 6,913,075 B1 * | 7/2005 | Knowles et al. | 165/185 |
| 6,960,334 B1 | 11/2005 | Matsui et al. | |
| 2003/0203139 A1 | 10/2003 | Ren et al. | |

FOREIGN PATENT DOCUMENTS

| | | |
|---|---|---|
| JP | 07069790 A | 3/1995 |
| JP | 09078242 A | 3/1997 |
| JP | 09204832 A | 8/1997 |
| JP | 11050259 A | 2/1999 |
| JP | 2000-231891 | 8/2000 |
| JP | 2001-189142 | 7/2001 |
| JP | 2002-518280 | 6/2002 |
| JP | 2002293521 A | 10/2002 |
| JP | 2004060130 A | 2/2004 |
| JP | 2004303521 A | 10/2004 |
| WO | WO 99/65821 A1 | 12/1999 |
| WO | WO 00/40509 | 7/2000 |
| WO | WO0040509 | 7/2000 |

OTHER PUBLICATIONS

JP 09078242 (Machine Translation) 1997 Amano Shunji.*
Japanese Office Action issued in Japanese Patent Application No. JP 2005-000803 dated Nov. 30, 2010.
N. Jiang et al. "Carbon nanowalls for field—emission and light-source applications.", Proc. Int. Disp. Workshops, 2004. 1253-1254. vol. 11.

(Continued)

*Primary Examiner* — Daniel H Miller
(74) *Attorney, Agent, or Firm* — McDermott Will & Emery LLP

(57) ABSTRACT

Provided is a method for uniformly producing a carbon film at a low cost with low power consumption. The method for producing a carbon film, including: a step of disposing a cylindrical member having an opening in part thereof in a vacuum chamber; a step of disposing a substrate inside the cylindrical member; a step of introducing a gas for carbon film production into the vacuum chamber; and a step of applying a voltage for plasma generation to the cylindrical member to thereby generate a plasma in the cylindrical member and to produce the carbon film on the surface of the substrate by the plasma.

18 Claims, 38 Drawing Sheets

(56) References Cited

OTHER PUBLICATIONS

Korean Office Action issued in Korean Patent Application No. 10-2005-7023130 mailed on Jan. 30, 2013.
Croci, Mirko et al. "A fully sealed luminescent tube based on carbon nanotube field emission." Microelectronics Journal. vol. 35. pp. 329-336. 2004.
Saito, Yahachi et al. "Field emission from carbon nanotubes and its application to electron sources." Carbon. vol. 38. pp. 169-182. 2000.
Japanese Office Action issued in Japanese Patent Application No. JP 2005-115558 dated May 17, 2011.
U.S. Appl. No. 60/099,708, Sep. 10, 1998, Ren et al., Corresponds to JP 2002-518280.

* cited by examiner

F I G. 2
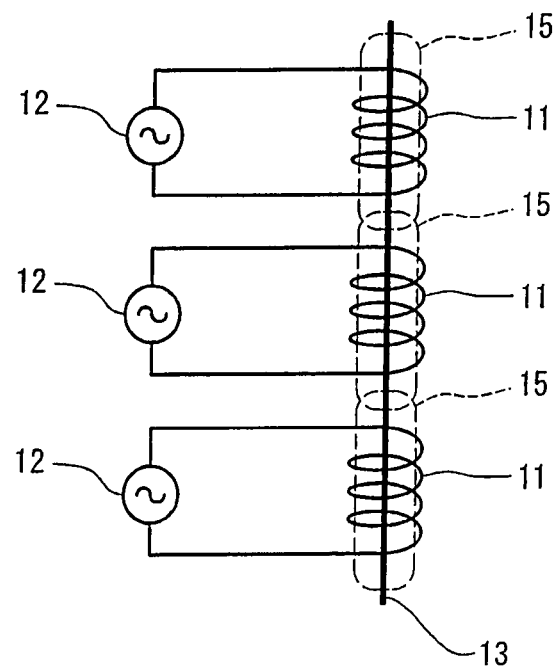
F I G. 3
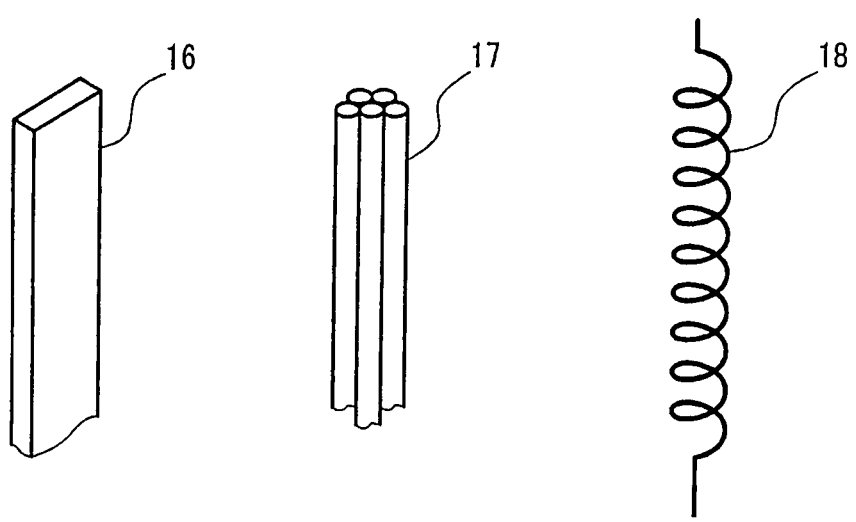

F I G. 1 0 A
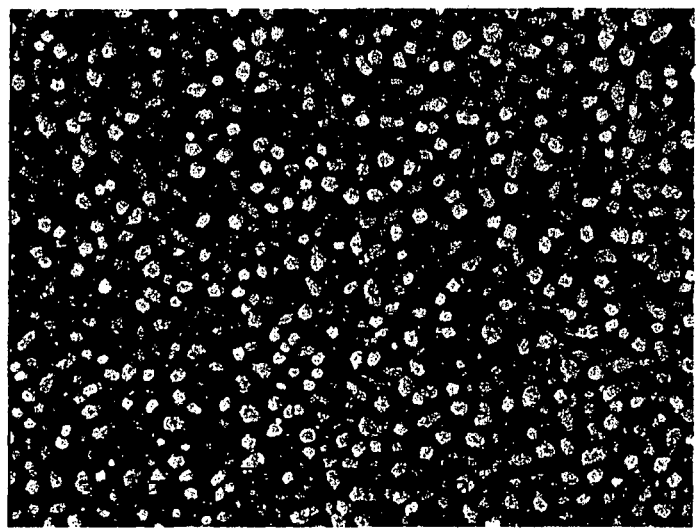
F I G. 1 0 B
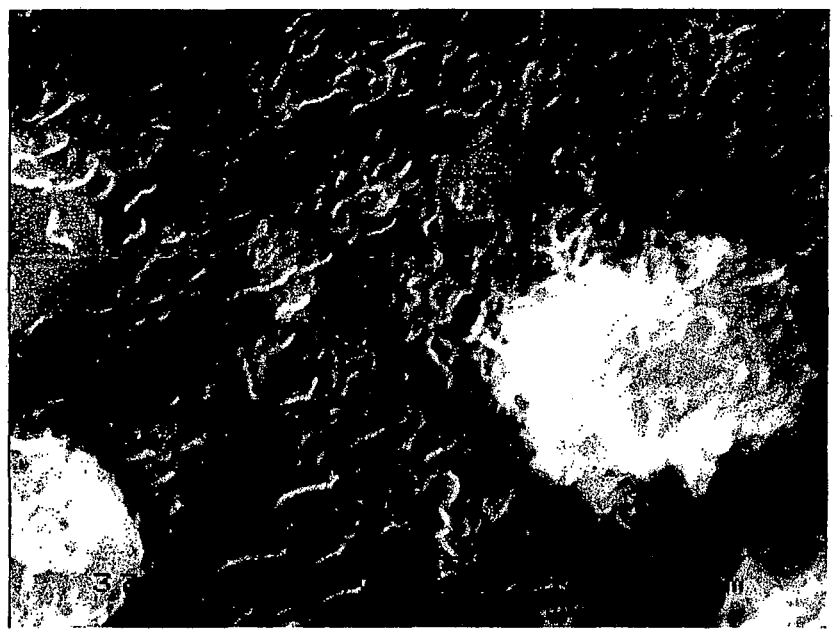

F I G. 1 2 A
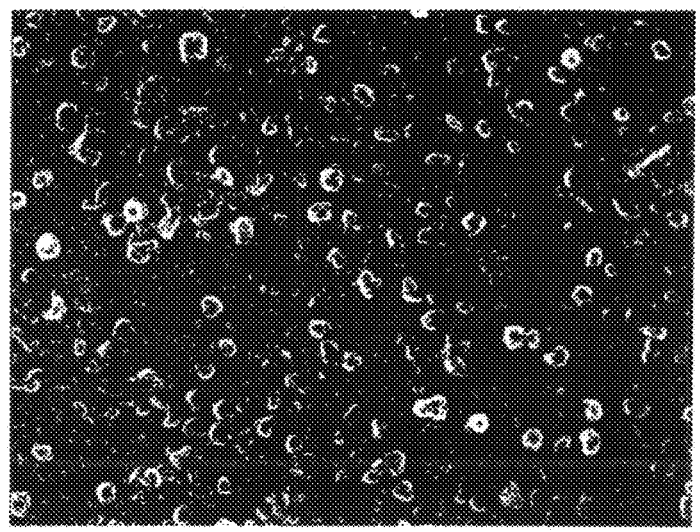
F I G. 1 2 B
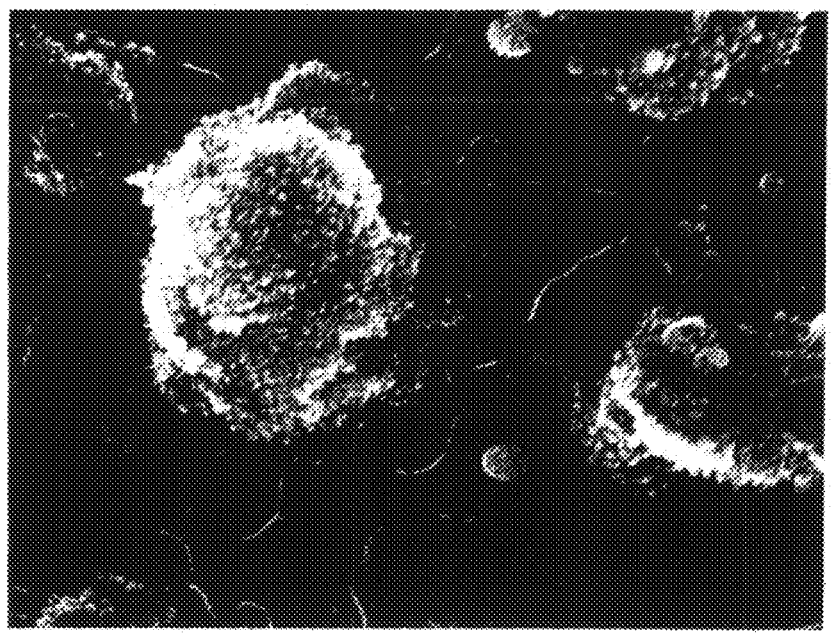

F I G. 1 4 A
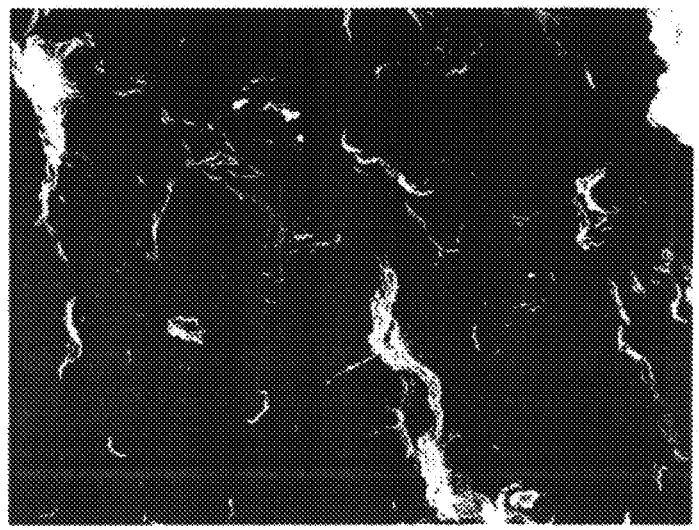
F I G. 1 4 B
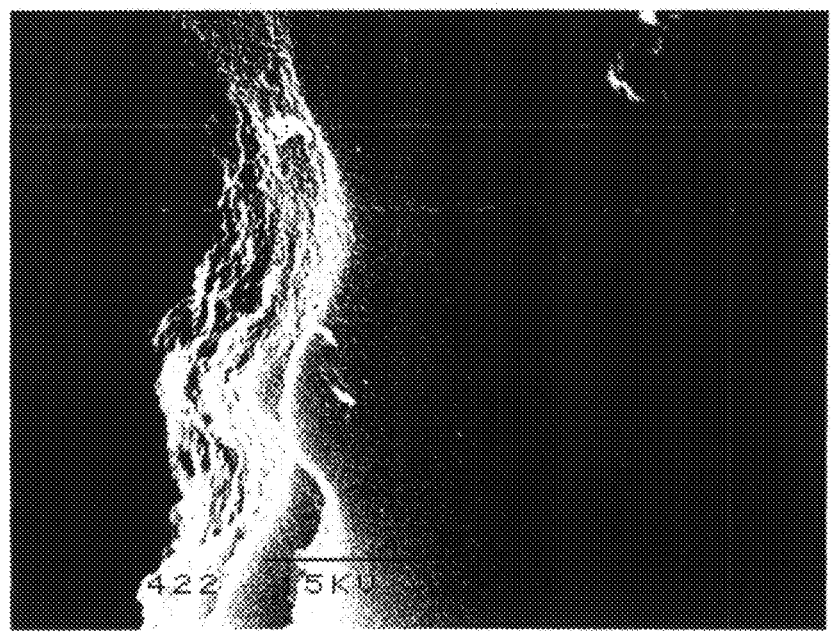

F I G. 1 6 A
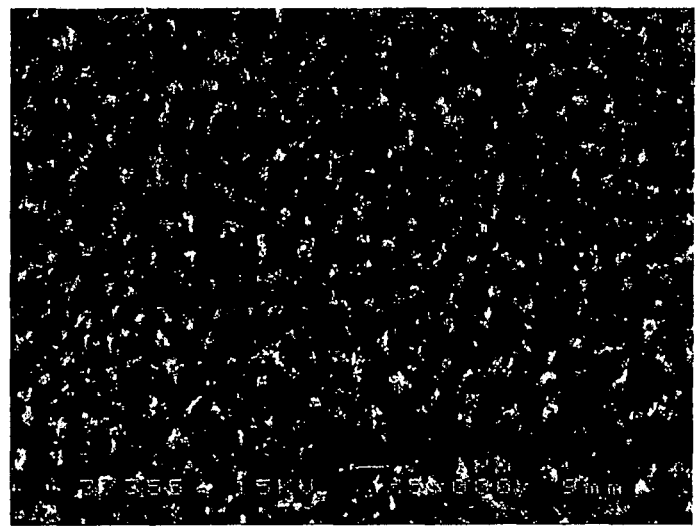
F I G. 1 6 B
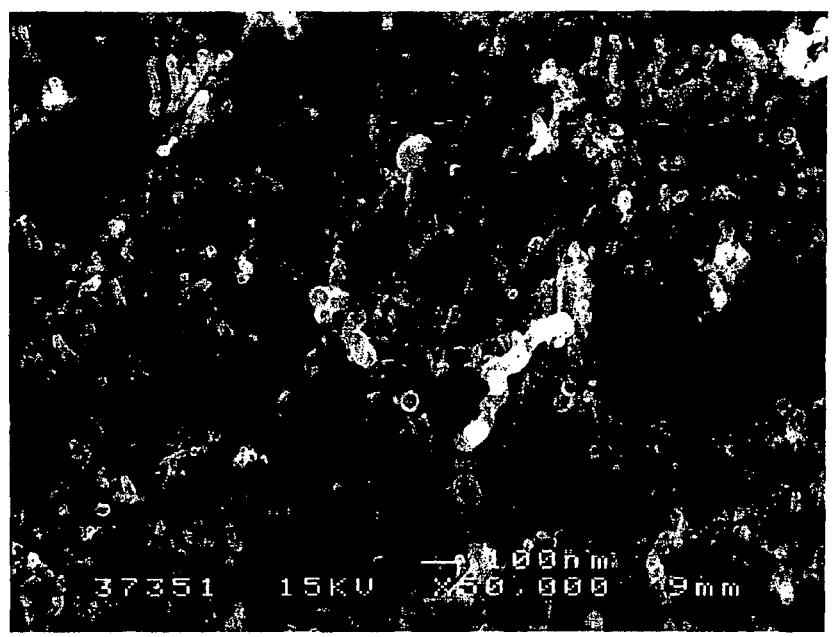

F I G. 1 7 A
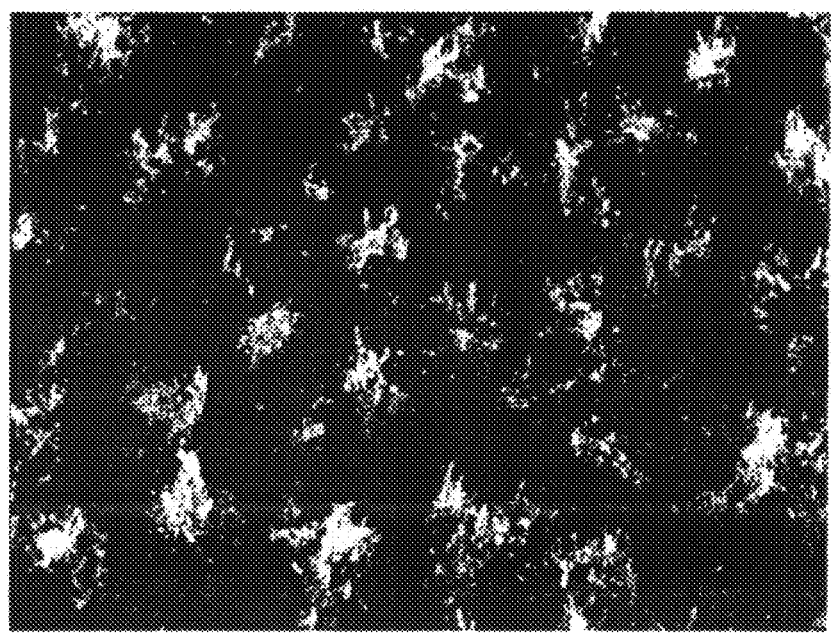
F I G. 1 7 B
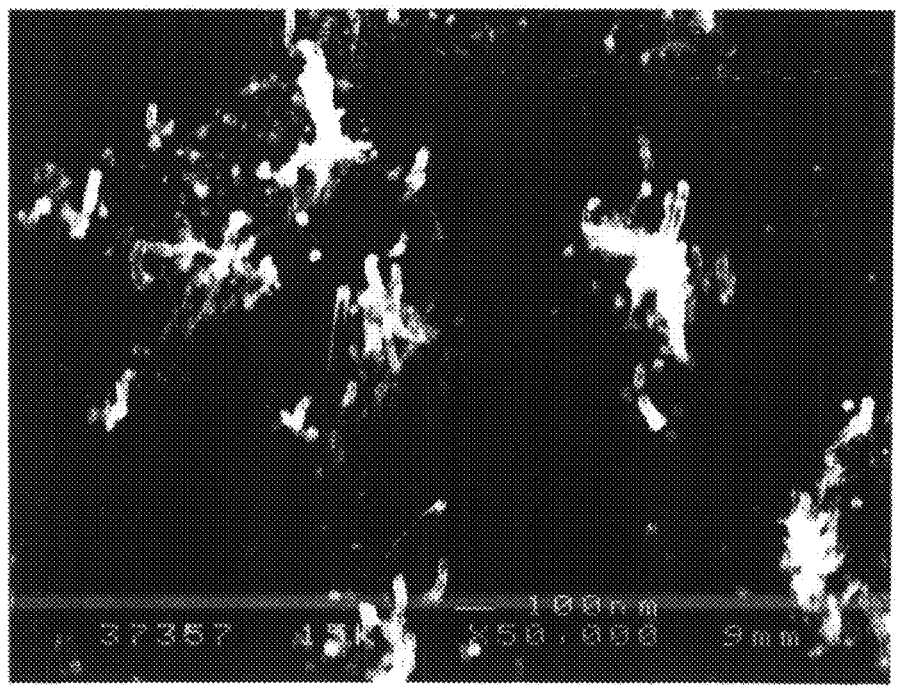

F I G. 1 7 C
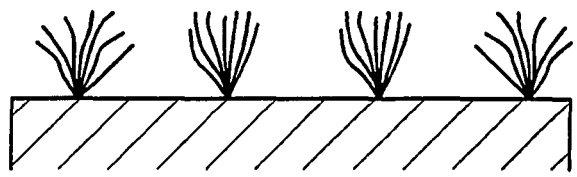

F I G. 2 1
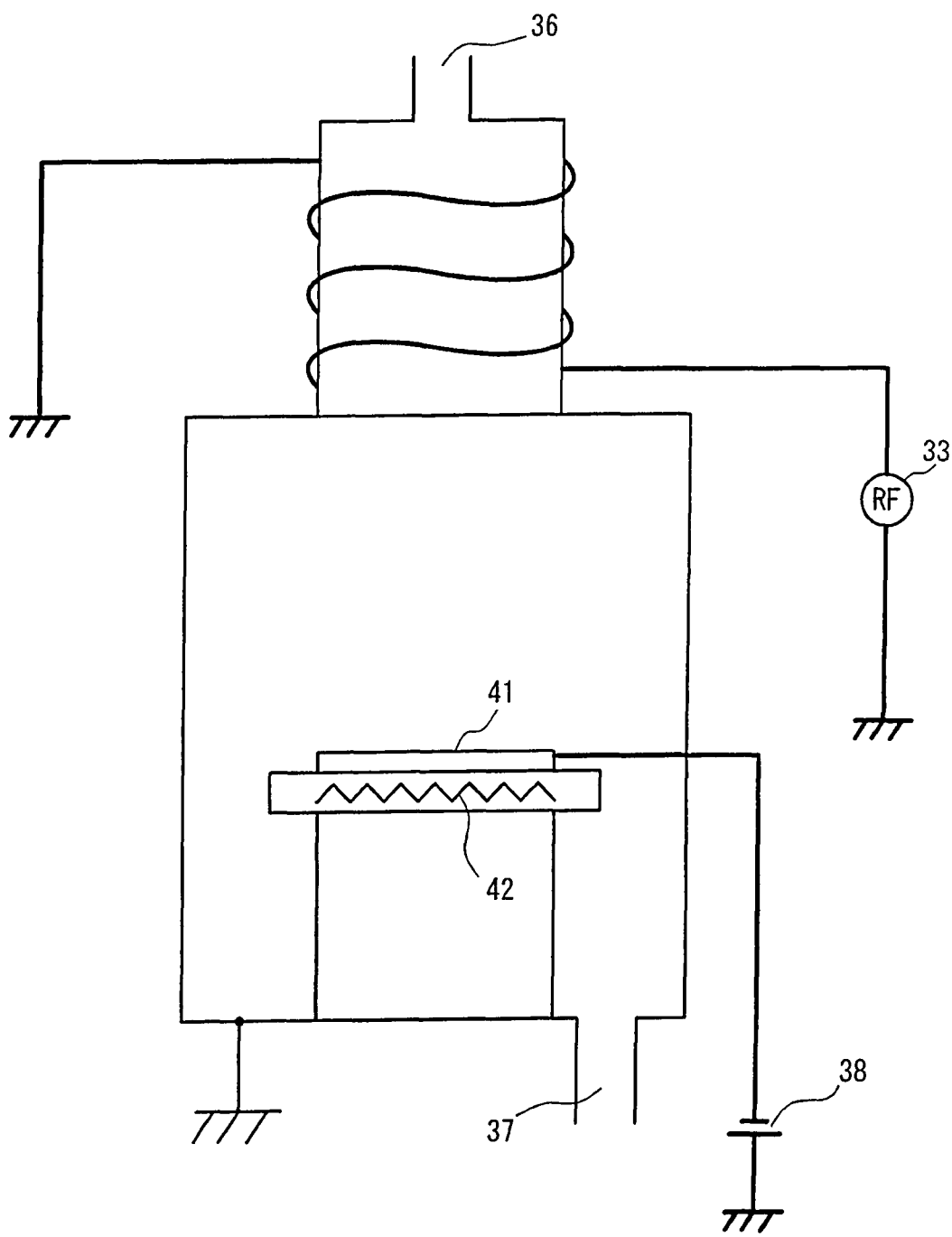

FIG. 23C
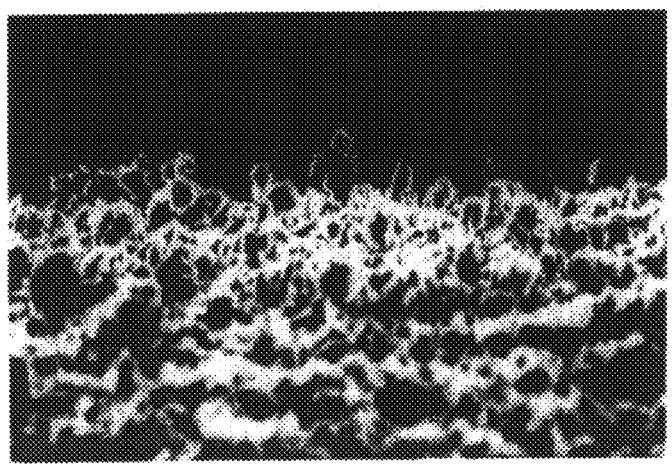
(photograph 1)
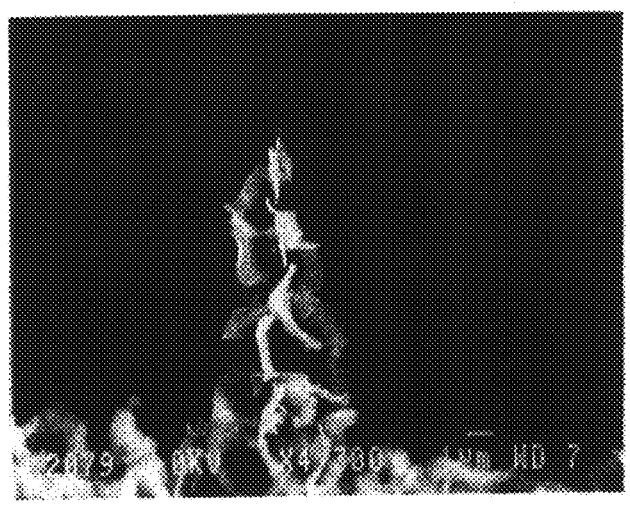
(photograph 2)

F I G. 27
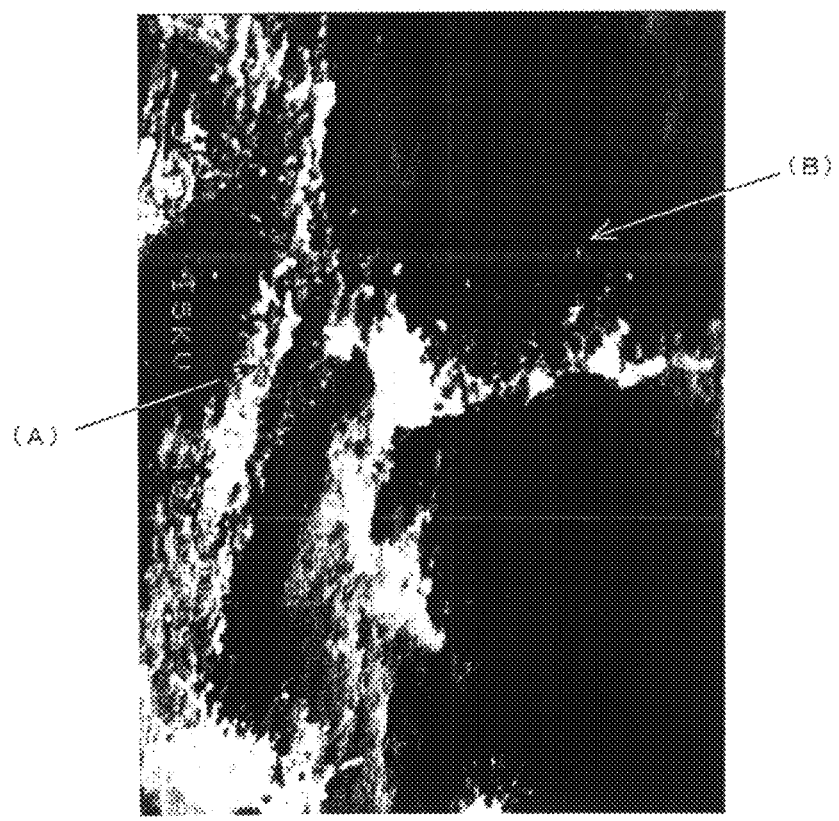

F I G. 28
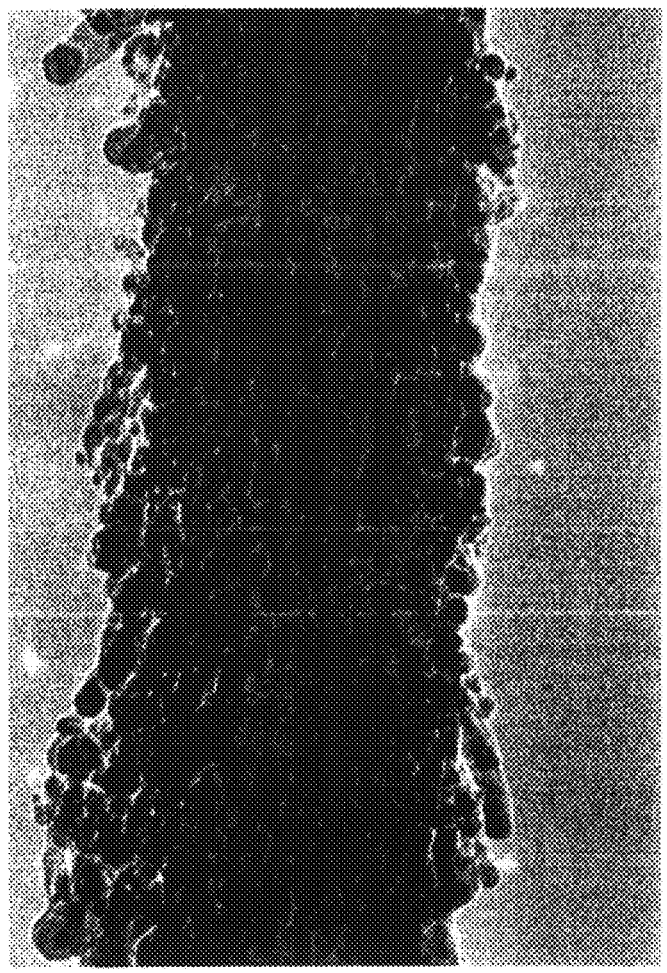

F I G. 3 0
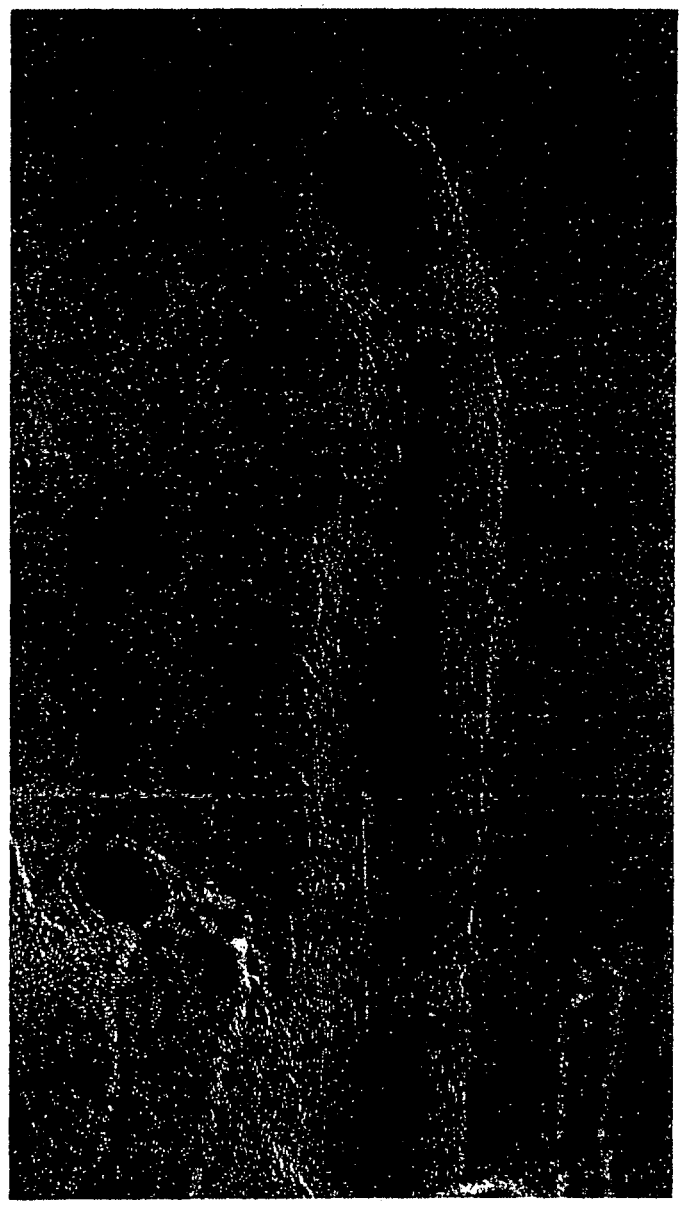

F I G. 3 3
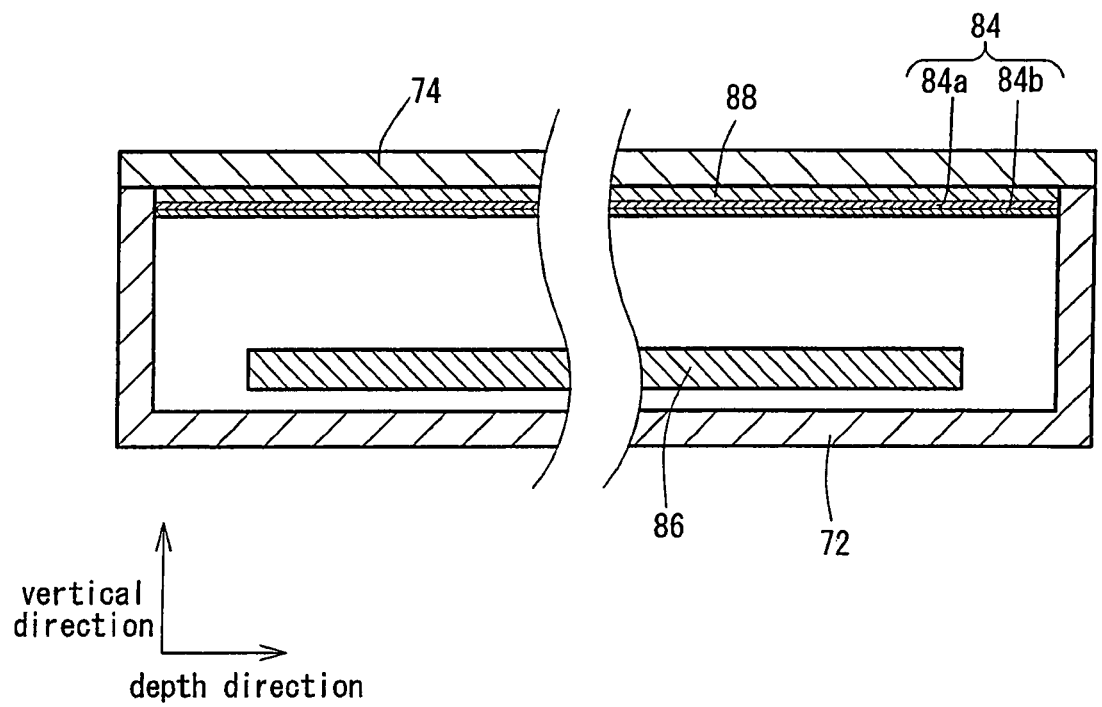

F I G. 3 8
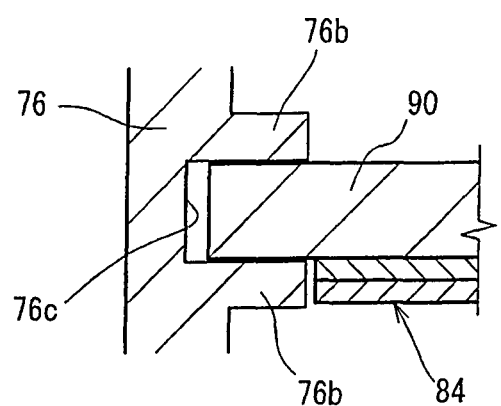

APPARATUS AND METHOD FOR PRODUCING CARBON FILM USING PLASMA CVD AND CARBON FILM

RELATED APPLICATION

This application is the U.S. National Phase under 35 U.S.C. §371 of International Application No. PCT/JP2005/018894, filed on Oct. 13, 2005, which in turn claims the benefit of Japanese Application No. 2005-000800, filed on Jan. 5, 2005, Japanese Application No. 2005-000803, filed on Jan. 5, 2005, and Japanese Application No. 2005-088813, filed on Mar. 25, 2005, and Japanese Application No. 2005-115558, filed on Apr. 13, 2005, and Japanese Application No. 2005-115560, filed on Apr. 13, 2005, the disclosures of which Applications are incorporated by reference herein.

BACKGROUND OF THE INVENTION

1. Field of the Invention

The present invention relates to an apparatus and a method for producing a carbon film with a nanostructure using plasma chemical vapor deposition, and a carbon film structure.

2. Description of the Related Art

In a plasma chemical vapor deposition (plasma CVD) method, a carbon film can be produced on a substrate. Generally, with the plasma CVD method, a material gas is introduced while controlling a gas pressure. Application of a DC power across a pair of plate electrodes facing each other generates a plasma. A substrate is heated. By controlling ion energy directed to the substrate, a carbon film is produced on the substrate (See JP-A No. 11-50259).

SUMMARY OF THE INVENTION

A plasma CVD method adopts a high gas pressure. A high voltage is applied in order to generate a plasma. It takes a long time for a film production. Film production on a substrate having a large area requires plate electrodes each having a large area. Carbon film production on a long wire requires a long electrode surface. An apparatus increases in size. An apparatus with a high cost is required. Especially, an electrode area increases as compared with a film production area on a wire, resulting in a waste in power consumption. A uniform carbon film cannot be produced all over the outer surface of a wire having a circular section.

The present invention includes a step of disposing a cylindrical member having an opening in part thereof in a vacuum chamber, a step of disposing a substrate inside the cylindrical member, a step of introducing a gas for carbon film production into the vacuum chamber, and a step of applying a voltage for plasma generation to the cylindrical member, through which a plasma is generated in the cylindrical member and a carbon film is produced on a surface of the substrate by the plasma.

The voltage is preferably a high frequency voltage.
The voltage is preferably a negative DC voltage.
The voltage is preferably a voltage obtained by superimposing a high frequency voltage on a negative DC voltage.

Of the above voltages, no limitation is placed on a way of applying the DC voltage. The DC voltage may be applied, for example, not only continuously but also as pulses.

The description "having an opening in part thereof" means that any opening provided on a cylindrical member is included. Also included as the opening in the description, for example, are an opening or openings at one end side or both end sides of a cylindrical member, or an opening on the circumferential wall.

An opening on the circumferential wall of the cylindrical member is, for example, in the shape of a spiral, a net or a slit, and a section of the cylindrical member is of any shape, not limited to circular or rectangular.

The term of "cylindrical" of the cylindrical member is not limited to the original sense of the word and includes even the shape of a box.

The shape of the substrate is not particularly limited if a carbon film can be produced thereon. The substrate may be in various kinds of shapes such as a plate or a cylinder, in addition to the line shape.

Examples of the carbon film include a carbon nanowall, a carbon nanotube, a carbon nanofiber and a carbon metal nanotree.

In the present invention, a plasma generated in an inner space of a cylindrical member has a high electron density. The plasma has a proper density and activity even in a pressure which is not high. Hence, a carbon film can be produced in a low pressure. A plasma generated in a cylindrical member is of a high density. Therefore, a carbon film can be produced efficiently with a low power.

Since a substrate is disposed in the inner space of the cylindrical member, the cylindrical member, if the substrate is a long wire, may be extended in a length-wise direction of the wire to enable a carbon film to be produced on a surface of the wire. Hence, it is possible to suppress a waste in power consumption and to efficiently produce a film. By disposing a substrate in the inner space of the cylindrical member, it is possible to produce a carbon film with a uniform thickness all over the outer surface of the substrate.

According to the present invention, a carbon film can be uniformly produced at a low cost with a low power consumption.

BRIEF DESCRIPTION OF THE DRAWINGS

FIG. 2 is a schematic diagram of a modification example of a coil in FIG. 1;

FIG. 3 is a partly perspective view of a wire in FIG. 1;

FIG. 10A is a photograph of an SEM image showing a state of a carbon film in a different condition for film production in FIG. 8;

FIG. 10B is a partly enlarged view of FIG. 10A;

FIG. 12A is a photograph of an SEM image showing a state of a carbon film in a different condition for film production in FIG. 8;

FIG. 12B is a partly enlarged view of FIG. 12A;

FIG. 14A is a photograph of an SEM image showing a state of a carbon film in a different condition for film production in FIG. 8;

FIG. 14B is a partly enlarged view of FIG. 14A;

FIG. 16A is a photograph of an SEM image showing a state of a carbon film in a different condition for film production in FIG. 8;

FIG. 16B is a partly enlarged view of FIG. 16A;

FIG. 17A is a photograph of an SEM image showing a state of a carbon film in a different condition for film production in FIG. 8;

FIG. 17B is a partly enlarged view of FIG. 17A;

FIG. 17C is a conceptual diagram showing a structure of a carbon film of FIG. 17A;

FIG. 21 is a diagram showing still another example of the apparatus of FIG. 1;

FIG. 23C is photographs of SEM images showing a state of a carbon film in a different condition for film production by the production apparatus of FIG. 22;

FIG. 27 is a photograph showing still another carbon metal nanotree;

FIG. 28 is a photograph showing still another carbon metal nanotree;

FIG. 30 is a photograph showing still another carbon metal nanotree;

FIG. 33 is a sectional view taken on line A-A of FIG. 31;

FIG. 38 is a sectional view of parts of a side panel and a heat resistant support member showing an example modification of a support section supporting the heat resistant support member;

DESCRIPTION OF THE PREFERRED EMBODIMENTS

The following describes preferred embodiments of the present invention in detail with reference to the accompanying drawings.

Figure 1:
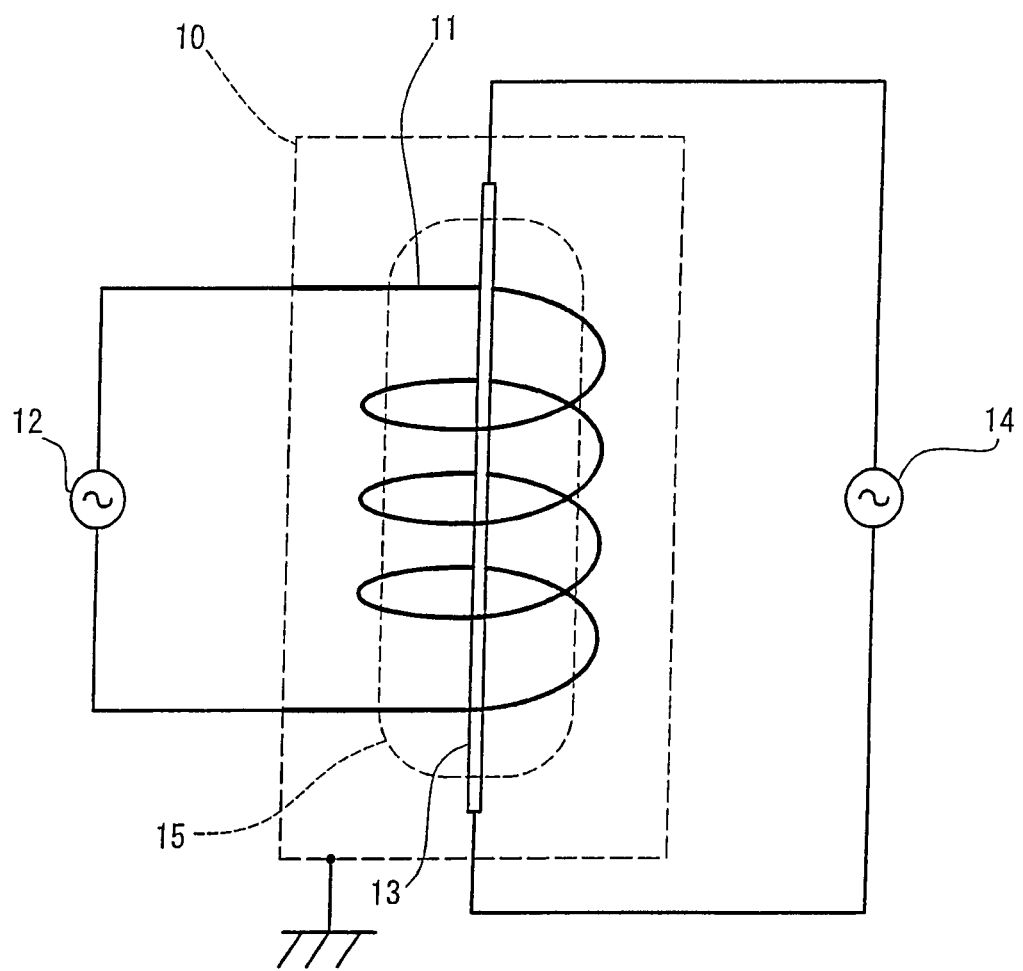
FIG. 1 is a schematic diagram of an apparatus for producing a carbon film related to an embodiment of the present invention.

In FIG. 1, there is shown an outline of an apparatus for producing a carbon film related to an embodiment of the present invention. In FIG. 1, a coil 11 is installed in a vacuum chamber 10 indicated with doted lines. The coil 11 is of a cylindrical member with a circumferential wall in the shape of a spiral. The cylinder 11 can be said to be a cylindrical member having an opening in part thereof. A material of the coil 11 is Cu, Ni, stainless steel, carbon or the like. A turn diameter, length and the like of the coil 11 can be selected according to a size of a substrate on which a carbon film is produced or other factors. The substrate is a conductive wire as an example. An inner space of the coil 11 is substantially in a shape of a cylinder extending in a length-wise direction of the coil 11.

A high frequency power supply 12 is connected to both ends of the coil 11. A power frequency of the high frequency power supply 12 is, for example, 13.56 MHz, 4 MHz, 27.12 MHz, 40.68 MHz or the like. A wire 13 is disposed in the inner space of the coil 11 along the length-wise direction of the coil 11. The wire 13 is located almost in the middle of the inner space of the coil 11 and a carbon film is produced to a uniform thickness all over outer surface thereof.

A material of the wire 13 is Ni, stainless, Fe, or the like. A diameter of the wire 13 is not limited. A diameter of the wire 13 is, for example, several millimeters, and, for example, in a range of 1 to 5 mm. A heating power supply 14 is connected to both ends of the wire 13. A heating temperature of the wire 13 when a current is supplied from a power supply 14 is in a range of 700° C. to 1000° C. It is preferable that the heating temperature is in a range of 800° C. to 1000° C. A heating temperature equal to or higher than 800° C. is preferable for reduction in film production time and improvement on film quality. A material gas such as a hydrocarbon gas is supplied into the vacuum chamber 10 at a controlled flow rate in a predetermined pressure in a state where the wire 13 is heated at 800° C. or higher. Examples of the material gas include $CH_4$ and $H_2$, $CH_4$ and Ar, $CH_4$ and $O_2$, and others. A gas after the processing is forced to flow outside the vacuum chamber 10.

A concentration of $CH_4$ in a mixed gas of $CH_4$ and $H_2$ is, for example, 90%, a concentration of $CH_4$ in a mixed gas of $CH_4$ and Ar is, for example, in a range of 20 to 60% and a concentration of $CH_4$ in a mixed gas of $CH_4$ and $O_2$ is, for example, 95%. Other hydrocarbon gases such as $C_2H_2$ may also be used.

A gas pressure in the vacuum chamber 10 is in a range of 0.1 to 50 Torr. It is preferable that the gas pressure is in a range of 1 to 10 Torr, and more preferably in a range of 0.5 to 50 Torr.

The high frequency power supply 12 supplies high frequency power of the order of 100 W to the coil 11. A plasma 15 is generated in the coil 11 by the supply. A region where the plasma 15 is generated, according to the experiment conducted by the present inventor, is a cylindrical region with a diameter of 50 mm and a length of 100 mm. The pressure at this point was around 0.75 Torr and the heating temperature of the wire 13 was around 800° C. A carbon film was produced all over the surface of the wire 13. A time spent for film production was about 30 min.

In the above experiments, the plasma 15 had a very high electron density and a carbon film was produced under a low pressure. The plasma is maintained at high density by supply a low power of the order of 100 W. A film production speed of a carbon film can be raised by increase in power supply. $CH_4$ is preferable as a material gas introduced into the vacuum chamber 10. $CH_4$ can works as a source for production of a high density carbon film because of efficient generation of a plasma therefrom. A short time film production can be realized.

By inserting the wire 13 through the coil 11, a carbon film can be produced all over the surface of the wire 13 easily.

In a case where a film is produced on a surface of a long wire 13, the coil 11 may be extended so as to be in a longer size. Even if a length of the wire 13 is longer than a height of the coil 11, it is possible to produce a carbon film on the wire 13 by moving the wire 13 vertically relative to the coil 11 or to the contrary, or the coil 11 vertically relative to the wire 13.

In a case where the length of a wire 13 is, as shown in FIG. 2, larger than the height of a coil 11 in the vertical direction, plural coils 11 are disposed together so that the wire 13 can be inserted therethrough. With such a construction adopted, the plasmas 15 generated in the respective coils 11 overlap each other, thereby enabling a carbon film to be produced all over the wire 13. The coil 11 may be positioned so as to extend in a lateral direction.

Examples of the wire 13, as shown in FIG. 3, include a plate-like wire 16, plural wires tied up in a bundle or twisted together 17, and a coil-like wire 18.

Then, description will be given of evaluation of a characteristic. Evaluation of a characteristic can be performed by electron emission, a scanning electron microscope (SEM) image and the Raman scattering spectroscopy.

Figure 4:
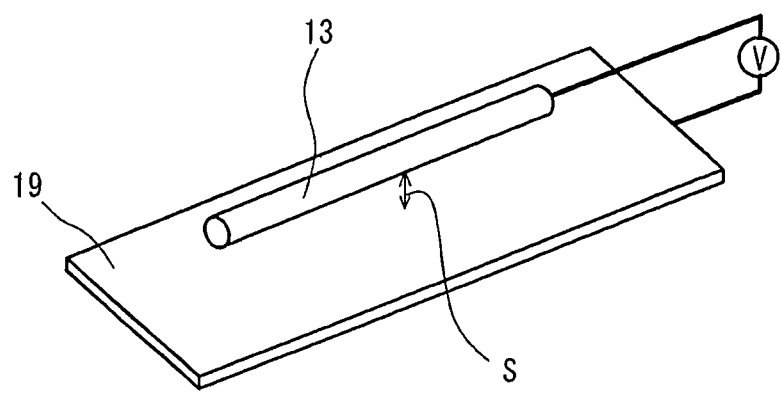
FIG. 4 is a schematic diagram of a construction for evaluation of a characteristic of electron emission in FIG. 1.

Electron emission was performed in a procedure that, as shown in FIG. 4, a wire 13 on which a carbon film is produced is disposed near a target (anode) 19 with a 1 mm space S therebetween in vacuum, and a DC voltage is applied between the wire 13 as a cathode and a target 19 to measure a current.

Figure 5:
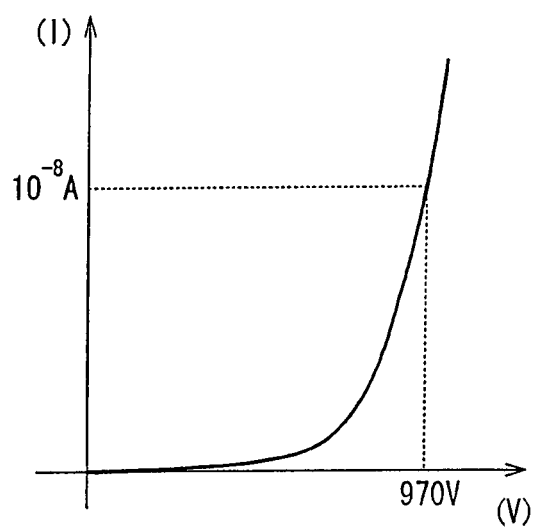
FIG. 5 is a graph of an electron emission characteristic in FIG. 1.

FIG. 5 shows a graph in which the abscissa is used for plotting a voltage and the ordinate is assigned to a current. In a construction of FIG. 4, 10A or 8A is a threshold current and the voltage is 970 V. Generally, an emission characteristic is 4 V/μm (=4 KV/mm) and it is understood that 970 V/mm in the embodiment is very excellent.

An SEM image of the wire 13 was observed and it was found that crystals excellent in emission characteristic grew. If crystals of a nanowall do not sufficiently grow, an emission characteristic is deteriorated. It is preferable that the crystals are in sizes raging from 1 to 10 μm, and if the crystal sizes are smaller than 1 μm, an emission characteristic becomes deteriorated.

The Raman scattering spectroscopy has only to have $R=I_{1580}/I_{1350}=4$ to 8 and in the embodiment, R=5 to 8, which is preferable result $I_{1580}$ is a peak value (G band) at 1580 $cm^{-1}$, and $I_{1350}$ is a peak value (D band) at 1350 $cm^{-1}$.

Gband corresponds to E2g vibration mode of graphite, while D band is caused by $sp^2$ fine crystals or a disorder $sp^2$ component. Hence, a larger R corresponds to a better crystallinity.

In production of a carbon film with such a construction, a carbon film can be produced on the wire 13 under a low pressure in a range of 0.1 to 50 Torr with a low power of 300 W for a short time of 30 min.

By inserting the wire 13 into the coil 11, a high quality carbon film with an almost uniform thickness can be produced all over the outer surface of the wire 13 with ease.

The above condition that a power of 300 W is applied to the coil 11 and a film production time is 30 min is just an example. The power and the film production time vary according to a material of the coil or the like. In this embodiment, a lower power and a shorter time are secured than in a conventional practice.

Examples of the carbon film produced on the coil 13 include a carbon nonowal, a carbon nanotube, a carbon nonofiber, and the like.

A carbon nanowall can be produced by means of the above method after the wire 13 is heated in a mixed gas of $CH_4$ and Ar at 1000° C. to form a carbide on the surface of the wire 13 prior to the step of producing a carbon nanowall on the wire 13.

In such a way, by forming carbide, a carbon nanowall is more rigidly produced than without the carbide.

The coil 11 made of Cu was used in the above apparatus to produce a carbon film on the wire 13 under the conditions below.

High frequency power: 200W
Heating temperature of a wire: 650° C.
Gas flows: $CH_4$: 2 ccm and $H_2$: 18 ccm
Gas pressure: 100 Pa
Film formation time: 30 min Since the wire 13 on which a carbon film was produced under the above conditions was of a good electric field electron emission characteristic, it is useful as a linear light source such as a low-profiled luminaire, a backlight for a display device or liquid crystal display device.

Description will be given of an example of a linear light source using a wire 13 on which a carbon film is produced, based on FIGS. 6 and 7.

Figure 6:
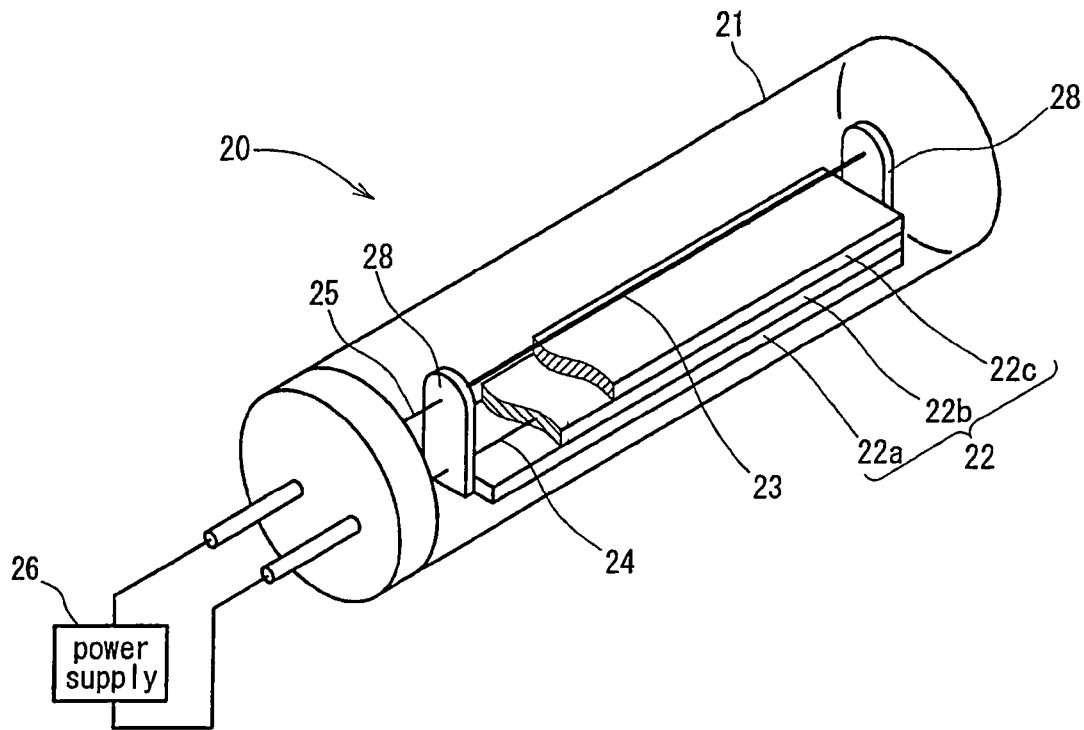
FIG. 6 is a perspective view showing an example of linear light source using a wire in FIG. 1.
Figure 7:
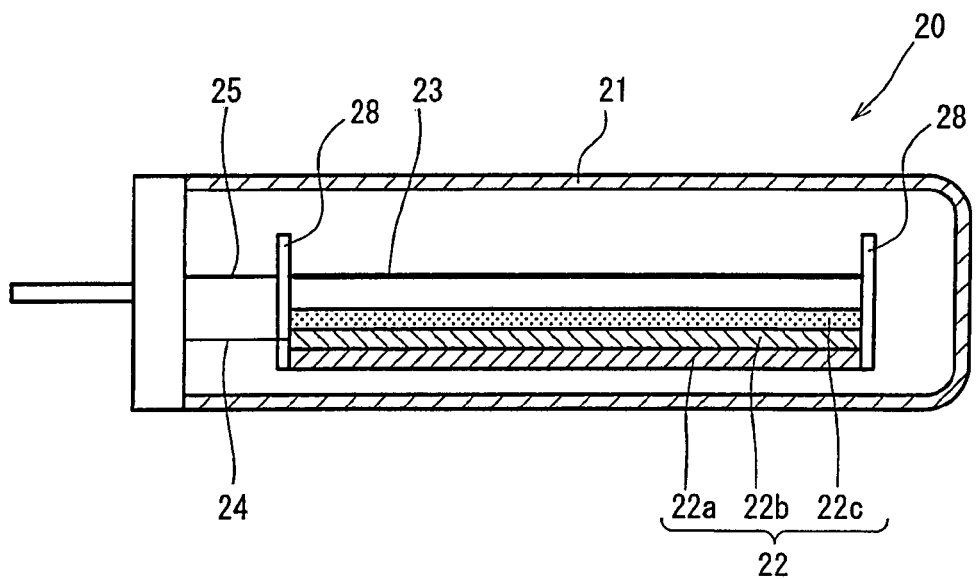
FIG. 7 is a sectional view of FIG. 6.

FIG. 6 is a perspective view of a linear light source preferable for, for example, a backlight or the like and FIG. 7 is a sectional view thereof.

A linear light source 20 has a cylindrical vacuum sealed tube 21. An anode section 22 is accommodated in the vacuum sealed tube 21. A wire 23 on which a carbon film is produced as a cathode section is placed right above the anode section 22 so as to face each other. The inside of the vacuum sealed tube 21 is maintained in a vacuum of the order $10^{-6}$ Torr.

The anode section 22 includes a glass substrate 22a, an anode 22b constituted of ITO formed on the glass substrate 22a, and a fluorescent substance 22c formed on the anode 22b.

Insulating support plates 28 are, each in a single piece with the anode section 22, protruded at both ends of the anode section 22 in the length-wise direction. A conductive wire 24 connected to a transparent electrode 22b and a conductive wire 25 connected to a wire 23 are inserted through and supported by support plates 28. In the linear light source 20, when a DC voltage from a power supply 26 is applied between the anode section 22 and the wire 23, electrons are emitted from the wire 23 into the vacuum. The electrons are attracted to the anode 22b and collide with the fluorescent substance 22c. By this, the fluorescent substance 22c is excited and emits light.

(Another Embodiment)

A carbon film such as a carbon nanotube is a material expected for many applications such as a display, a lamp, a nanodevice and an electron gun. A vapor phase growth method is used as a method for producing a carbon film. In a vapor phase growth method, a necessity arises for forming a catalyst in advance on a substrate prior to a carbon tube growth.

Contrast thereto, in the embodiment, no necessity arises for providing a catalyst metal to a substrate in advance prior to carbon film production.

Figure 8:
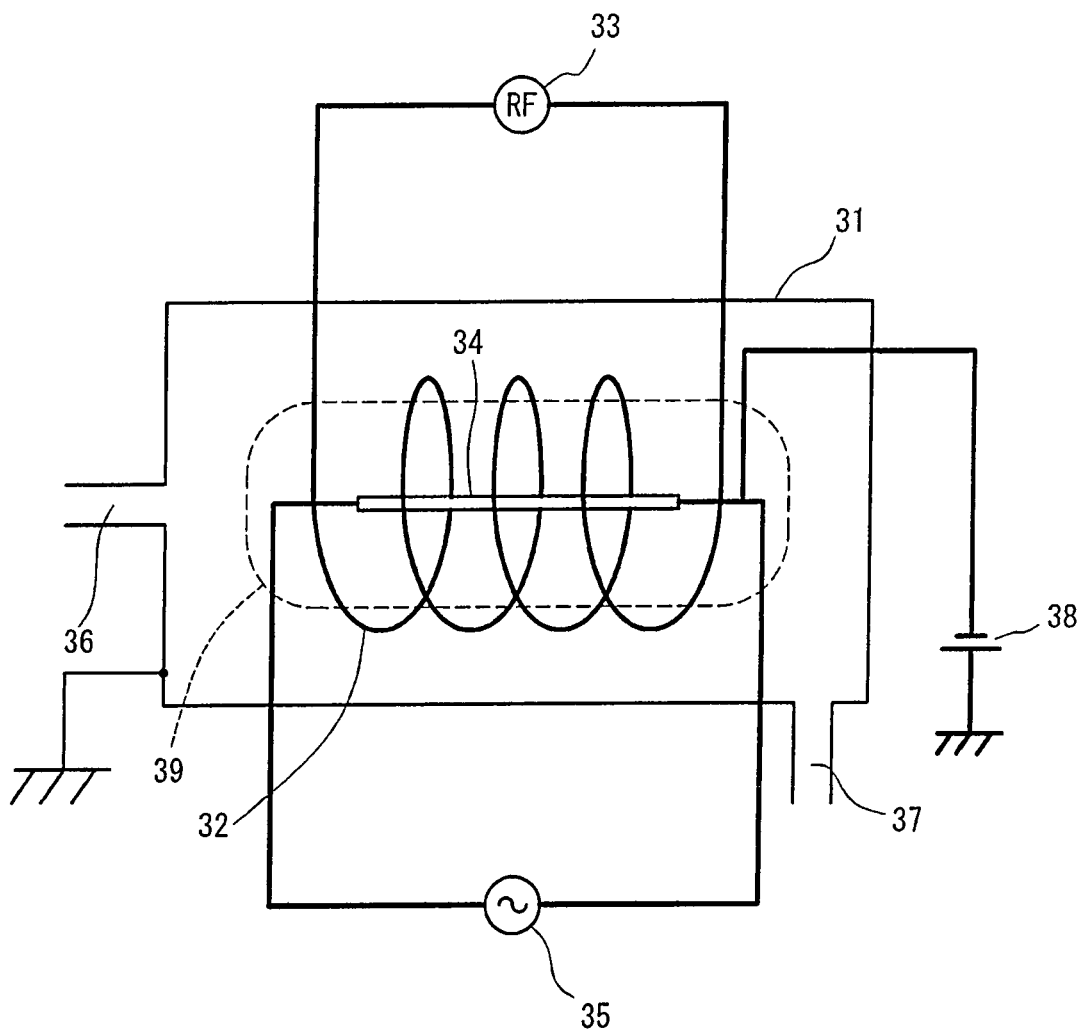
FIG. 8 is a schematic diagram of an apparatus for producing a carbon film related to another embodiment of the present invention.

In FIG. 8, there is shown a simple construction of a production apparatus related to the embodiment. A coil 32 is installed in a vacuum chamber 31. The coil 32 is made of, for example, Cu, Ni, stainless steel, carbon or the like. The coil 32 is connected to a high frequency power supply 33. Disposed inside the coil 32 is a substrate on which a carbon film such as a carbon nanotube is produced. A diameter of the wire 34 is, for example, around of 1 mm. The wire 34 preferably includes a metal serving as a catalyst for production of a carbon film. Examples of the metal include stainless steel, Fe, and Ni.

A heating power supply 35 is connected to the wire 34. The wire 34 is heated to a temperature of the order in a range of 700° C. to 800° C. by the power supply 35. The wire 34 is not limited to a linear shape, and may be of a coil-like shape or a wavy shape, or plural wires in a twisted state.

A gas inlet 36 and a gas outlet 37 are equipped to the vacuum chamber 31. A carbon containing material gas and a career gas, such as $CH_4$ and $H_2$, $CH_4$ and Ar or $CH_4$ and $O_2$, is introduced from the gas inlet 36 and the gas after the processing is forced to flow out through the gas outlet 37.

A gas pressure (total pressure) is preferably in a range of 10 Pa to 1000 Pa.

A DC power supply 38 is connected to the wire 34. A negative DC voltage is applied to the wire 34.

The embodiment has no step of forming a catalyst metal in advance on the wire 34 on which a carbon film is to be produced. The wire 34 is inserted and supported in the coil 32 in the vacuum chamber 31.

Then, a current is supplied into the wire 34 to heat it. On the other hand, a negative DC voltage is applied to the wire 34. In addition, a high frequency power is supplied to the coil 32. A material gas is introduced through the gas inlet 36 while a flow rate thereof is controlled. By this, a plasma 39 is generated in the coil 32. The material gas is excited by the plasma 39 to thereby produce a carbon film on the outer surface of the wire 34.

Description will be given of a reason that a catalyst metal is formed in advance on the wire 34.

A negative DC voltage is applied to the wire 34.

Therefore, the surface of the wire 34 is sputtered.

Fine particles of a catalyst metal included in the sputtered wire 34 are attracted to the wire 34 side and attaches to the surface of the wire 34 because of a comparatively high gas pressure.

The attached fine particles serve as a catalyst to grow a carbon film such as nanotubes.

Then, conditions for the growth, especially a DC bias voltage, is varied and a state of a produced film and a electron emission characteristic were evaluated.

Figure 9:
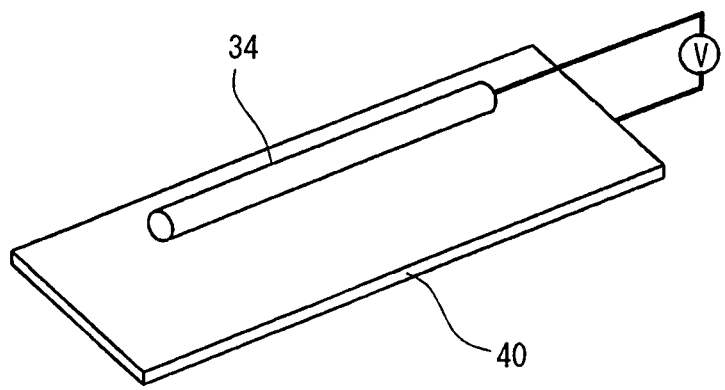
FIG. 9 is a descriptive diagram of a method for evaluating an electron emission characteristic in FIG. 8.
Figure 11A:
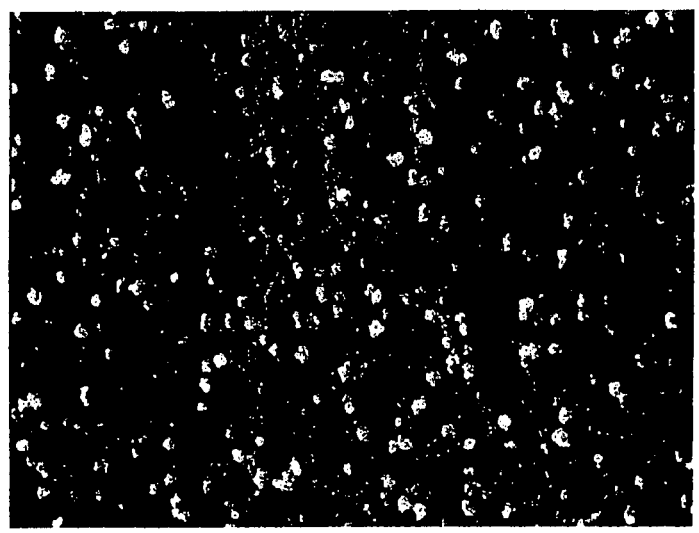
FIG. 11A is a photograph of an SEM image showing a state of a carbon film in a different condition for film production in FIG. 8.
Figure 11B:
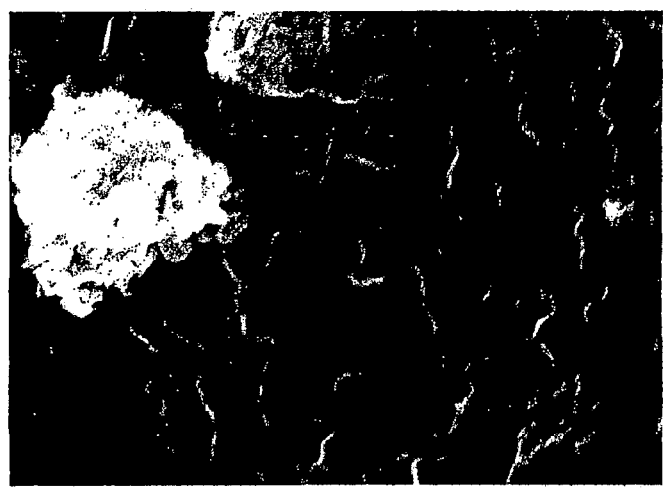
FIG. 11B is a partly enlarged view of FIG. 11A.
Figure 13A:
FIG. 13A is a photograph of an SEM image showing a state of a carbon film in a different condition for film production in FIG. 8.
Figure 13B:
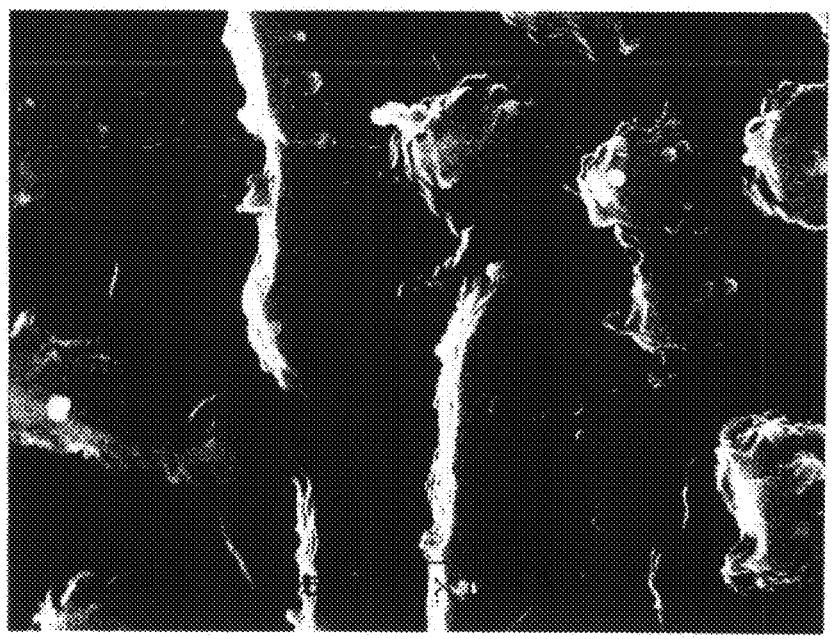
FIG. 13B is a partly enlarged view of FIG. 13A.
Figure 15A:
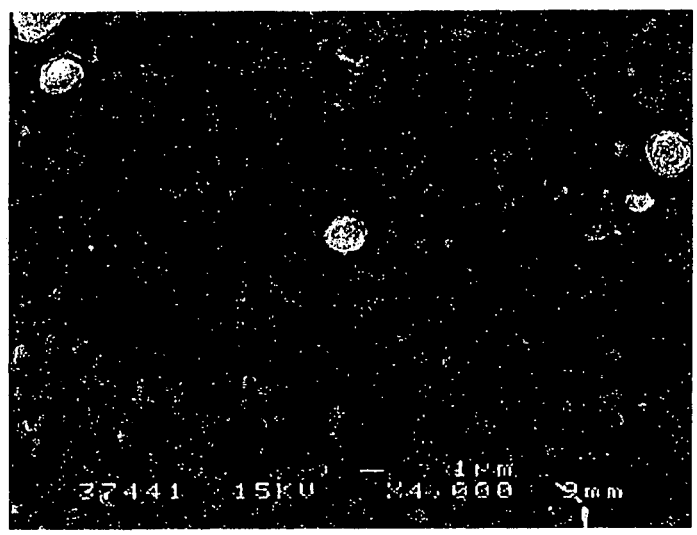
FIG. 15A is a photograph of an SEM image showing a state of a carbon film in a different condition for film production in FIG. 8.
Figure 15B:
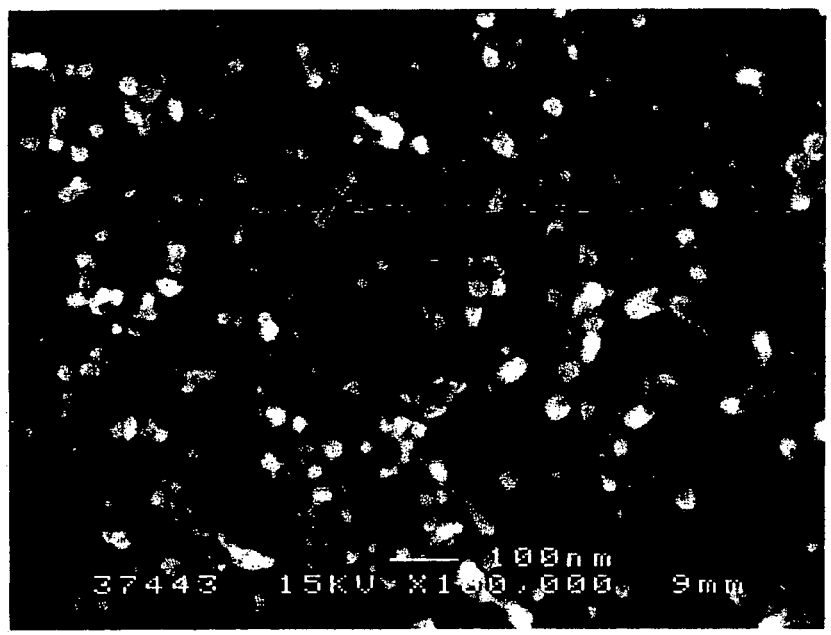
FIG. 15B is a partly enlarged view of FIG. 15A.

An electron emission characteristic thereof is measured in such a way that as shown in FIG. 9, a wire 34 on which carbon nanotubes are produced are placed above an anode 40 with a clearance of 1 mm in vacuum. A DC voltage is applied to the wire 34 as an anode. An emission current at 5 V/μm was measured.

In Table 1, conditions for film production, emission characteristics, and results of evaluation of states of films on SEM images.

TABLE 1

| Condition No. | Gas Flow Rate (sccm) | | Input Power (W) | Voltage (V) | Current (A) | Time (min) | Temperature (° C.) | Bias (V) | Pressure (Pa) | Film State | Farsightedness Emission Characteristic (5 V/μm) |
|---|---|---|---|---|---|---|---|---|---|---|---|
| | $CH_4$ | $H_2$ | | | | | | | | | |
| 1 | 2 | 18 | 200 | 3.5 | 8 | 60 | 742 | 0 | 100 | CNW (small) | None |
| 2 | 2 | 18 | 200 | 3.7 | 8 | 120 | 700 | −25 | 100 | CNW (middle) | 0.8 μA |
| 3 | 2 | 18 | 200 | 3.7 | 8 | 120 | 710 | −50 | 100 | CNW (large) | 0.24 μA |
| 4 | 2 | 18 | 200 | 3.38 | 8 | 60 | 830 | −100 | 100 | Step-like Graphite | 0.52 μA |
| 5 | 6 | 14 | 200 | 3.84 | 8 | 120 | 711 | −100 | 100 | Graphite Growth | 2 μA |
| 6 | 2 | 18 | 200 | 3.5 | 8.2 | 60 | 700 | −160 | 100 | CNT (small quantity) | None |
| 7 | 2 | 18 | 200 | 3.9 | 8.1 | 60 | 750 | −160 | 100 | CNT | 11 μA |
| 8 | 2 | 18 | 200 | 3.4 | 8 | 60 | 700 | −160 | 100 | CNT | 5.4 μA |

In Table 1, the input power indicates a high frequency power supplied to the coil 32, the voltage and the current indicate a voltage and a current applied to and fed into the wire 34 for heating thereof, the time indicates a time period for film production, the temperature indicates a temperature of the wire, the pressure indicates a total pressure of a mixture of $CH_4$ and $H_2$, and the electron emission characteristic indicates an emission current measured in the above described manner.

In Figs. 10A and 10B to 17A and 17B, there are shown SEM images of carbon films produced in respective conditions.

Condition No. 1 is a condition where no negative DC voltage is applied and small growth of carbon nonowalls (CNWs) were observed. No electron emission current at 5 V/μm was recognized.

Conditions Nos. 2 to 5 are conditions where the absolute values of negative DC voltages are increased and growth of the carbon nanowalls (CNWs) becomes larger in accordance with increase in negative DC voltage. Further, growth of graphite was observed. An increase in electron emission current at 5 V/μm was recognized.

At a DC voltage of −160 V, as shown in conditions Nos. 6 to 8, growth of carbon nanotubes (CNTs) were recognized.

In Conditions Nos. 7 and 8, electron emission current at 5 V/μm was recognized. It is preferable that the absolute value of a negative DC voltage is equal to or greater than 100 V.

As shown above, by conducting plasma CVD under application of a negative DC voltage to the wire 34, carbon nanotubes can be produced on the wire 34 on which no catalyst is formed in advance.

Special attention should be paid to FIGS. 17A and 17B. The carbon nanotubes in this case are shown in FIG. 17C in terms of a conceptual structure of a carbon film. A carbon nanotube alone causes fluctuations in light emission and a change in brightness due to sway or wear of a distal end thereof with a high aspect ratio. On the other hand, carbon nanotubes densely aggregated are hard to realize or lack electric field concentration. Therefore, in some case, a cluster of many carbon nonotubes is divided into groups and each group is formed as a carbon fiber bundle in which plural carbon nanotubes are aggregated.

A conventional carbon fiber bundle, however, still had a disadvantage that electric field concentration is hard to occur, though the carbon fiber bundle itself causes electric field concentration with ease, as compared with a carbon tube alone since, in a conventional fiber bundle, carbon tubes in the bundle are densely aggregated in both the proximal end side and distal end side thereof.

A carbon fiber bundle shown in FIG. 17C has the proximal end side where carbon tubes are aggregated, while having the distal end side where carbon tubes are not aggregated and spread outward like petals. Therefore, electric field concentration occurs with extreme ease as done in a carbon nanotube alone, whereas sway and wear of the distal end of a carbon nanotube are harder to cause fluctuation in light emission or a change in brightness as a whole, which is different from a carbon nanotube alone. Conditions for producing a carbon film of FIG. 17 were such that flow rates of $CH_4$ and $H_2$ are 2 ccm and 18 ccm, respectively, a substrate temperature is 650° C., a pressure is 100 Pa, an AC power 200 W, a bias is −100 V and a film production time is 30 min.

In a case where a wire 34 on which carbon nanotubes are produced is too long and therefore, extends outside a plasma generation region of the coil 32, the wire 34 is preferably moved relative to the coil 32 to thereby produce a film across the entire length of the wire 34.

Figure 18:
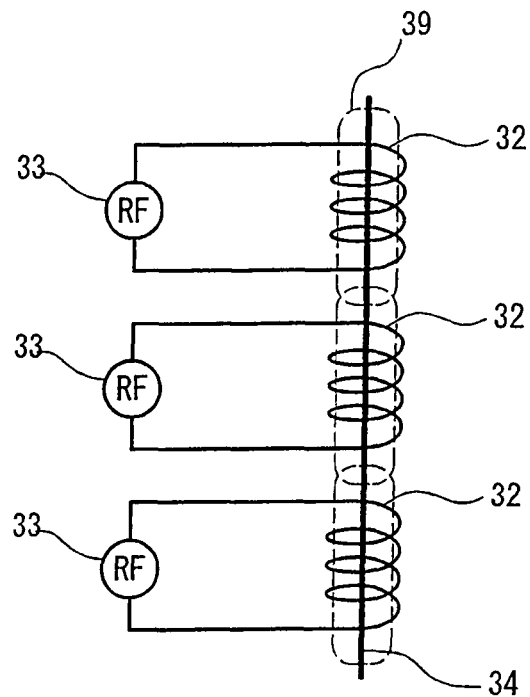
FIG. 18 is a schematic diagram of an example modification of the coil in FIG. 1.

In a case where the wire 34 is longer than the coil 32, as shown in FIG. 18, plural coils 32 are disposed together along in a length-wise direction of the wire 34. With such a construction adopted, plasmas generated in the coils 32 are advantageously overlapped on each other to thereby produce a film across the whole of the wire 34.

Figure 19:
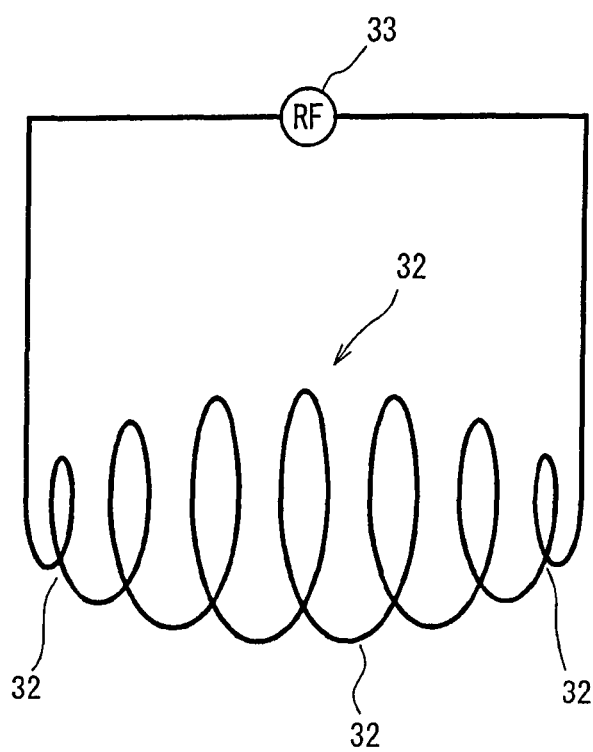
FIG. 19 is a schematic diagram of another example modification of the coil in FIG. 1.

As shown in FIG. 19, diameters of turns in a middle portion 32a in a length-wise direction of the coil 32 may be larger, while those at both end portions 32b may be smaller so as to efficiently confine a plasma in the middle portion, thereby enhancing a film production speed.

(Yet Another Embodiment)

Figure 20:
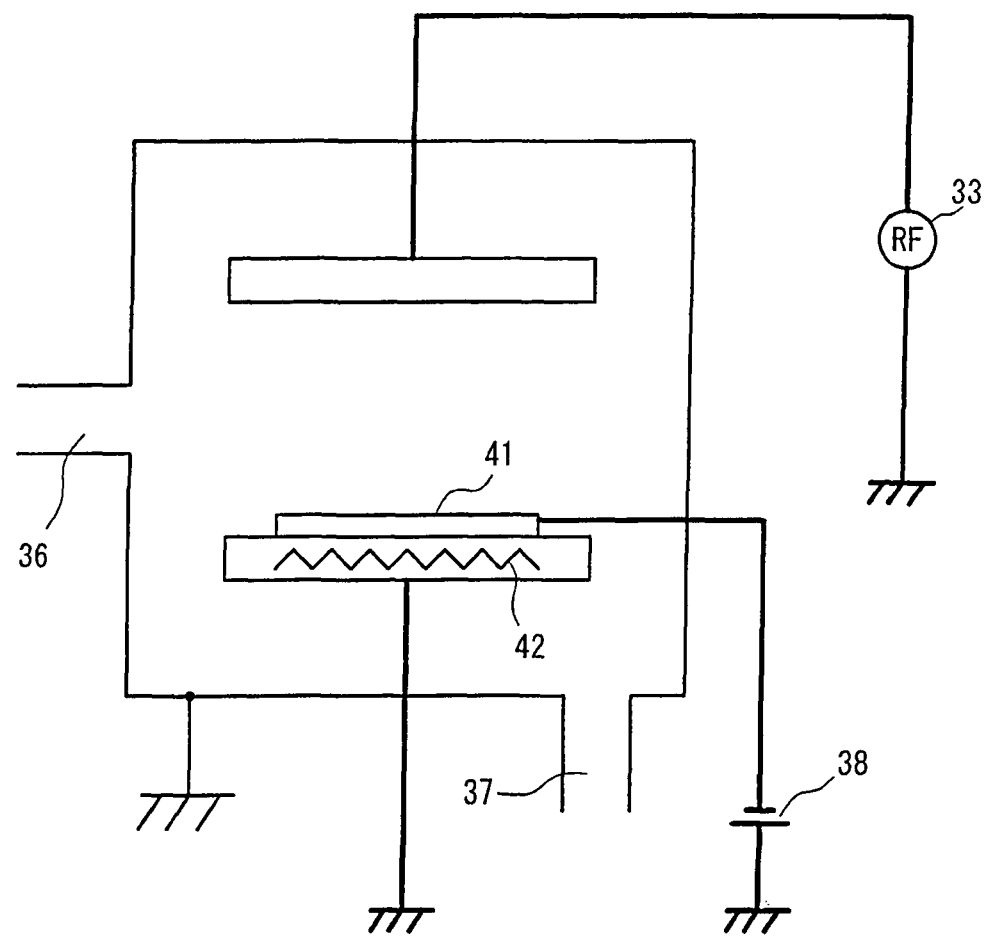
FIG. 20 is a diagram showing another example of the apparatus of FIG. 1.

As another embodiment, a case is shown where a negative DC voltage is applied to a wire 41 in a plasma CVD apparatus of a capacitive coupling type shown in FIG. 20, or a plasma CVD apparatus of an inductive coupling type shown in FIG. 21. The wire 41 can be heated indirectly by a heater 42 or the like. Application of a DC voltage can be implemented only at an initial stage of film production for carbon nanotubes.

(Still Another Embodiment)

In a production apparatus using a plasma, a coil is wound around the outer surface of a vacuum chamber. A current from a high frequency power supply is supplied into the coil to thereby generate a plasma in the vacuum chamber. In the production apparatus, a necessity arises for supplying a high frequency power through an impedance matching circuit from the high frequency power supply.

Hence, in order to produce a film on the surface of a long wire using the plasma generating apparatus, many of impedance matching circuits are equipped to thereby extend the coil and to thereby render a plasma longer. Hence, a result is a considerable cost required.

In the embodiment, a production apparatus enables a coil to be extended to thereby render a plasma longer without a necessity for using an impedance matching circuit.

In the production apparatus of the embodiment, a conductive cylindrical member having an opening in at least one part of the circumferential wall is installed in the vacuum chamber under a pressure which is reduced and that is filled with a plasma generating gas atmosphere. A negative DC voltage is applied to one end side of the cylindrical member. Cylindrical members with an opening include: a coil with a circumferential wall in the shape of a spiral and a cylindrical member with a circumferential wall with mesh net or slits. A cylindrical member may adopt any shape that can confine a plasma in a space therein.

In the embodiment, a negative DC voltage is applied to one end side of the cylindrical member. No DC power supply is connected to the other end side of the coil. The other end side of the coil is, for example, in he floating state. With such a construction adopted, a plasma can be generated and confined in an inner space of the coil.

Such an apparatus dose not have any necessity for installing an impedance matching circuit in the extension of the coil if the coil is extended. Therefore, the extension of the coil is very simple. The production apparatus can be easily constructed at a low cost. In addition, a long plasma can be stably sustained for a long period.

In a case where a carbon film is produced on the surface of a long film producing object as an example of application of this apparatus, the coil has only to be extended so as to match with a length of the film producing object. Hence, a film production cost is low. In this production apparatus, a carbon film for electron emission is produced on the surface of a wire as a cathode for electron emission to emit electrons by application of an electric field across the cathode and an anode. The electrons are caused to collide with a fluorescent substance to enable the substance to be excited for light emission.

The production apparatus can be used as a plasma generating apparatus performing plasma treatment such as a plasma CVD apparatus, a plasma etching apparatus and a plasma plating apparatus.

Description will be given of the embodiment below with reference to the accompanying drawings.

Figure 22:
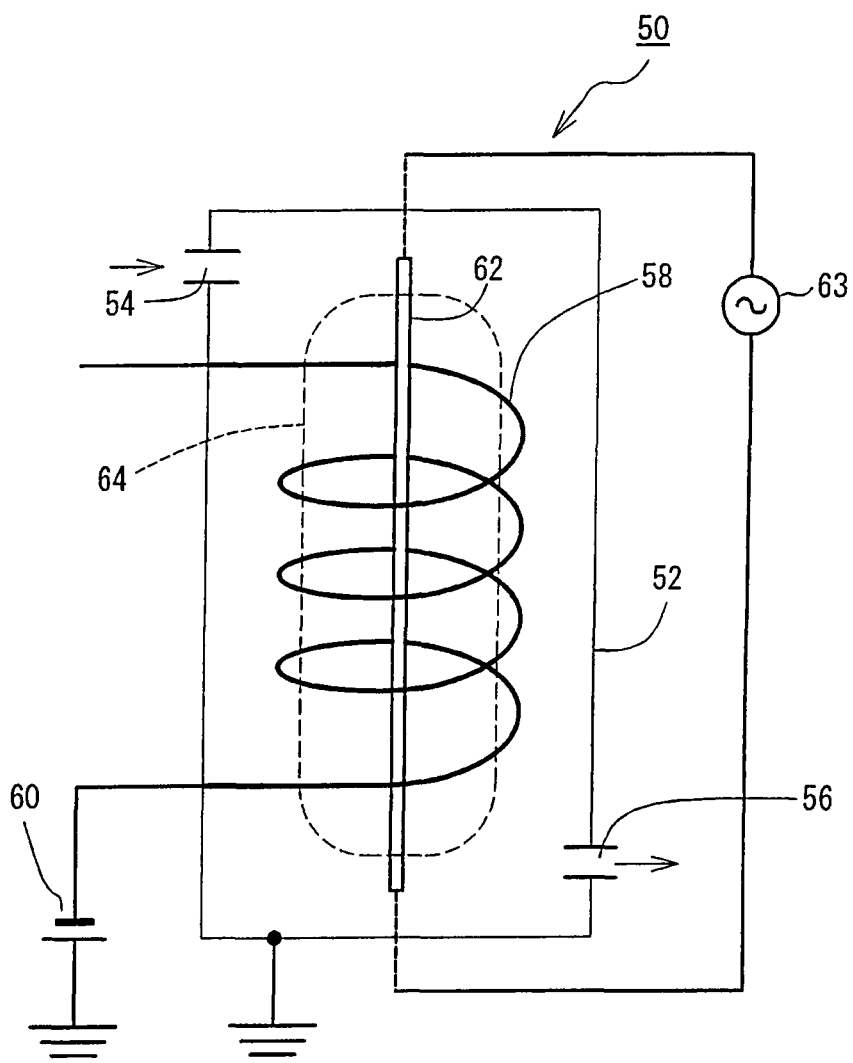
FIG. 22 is a diagram showing yet another embodiment of the apparatus of FIG. 1.

Referring FIG. 22, a production apparatus 50 equipped with a cylindrical vacuum chamber 52 made of a metal such as a stainless steel or the like. The vacuum chamber itself may be made of a metal. The vacuum chamber 52 can be constructed such that the outer circumferential wall surface is coated with an insulating material from the viewpoint of safety and the inner circumferential wall surface is made of a metal. No specific limitation is imposed on a metal material for the vacuum chamber 52.

The vacuum chamber 52 is grounded. A gas inlet 54 and a gas outlet 56 are provided to the vacuum chamber 52. A plasma gas generation gas includes an active gas and an inert gas. For example, hydrogen gas is used as an active gas. For example, argon gas is used as an inert gas. A pressure in the vacuum chamber is preferably in a range of 10 Pa to 10000 Pa.

A metal coil 58 is placed inside the vacuum chamber 52. No specific limitation is imposed on a material of the coil 58. One example of a material of the coil 58 is a stainless steel.

One end side of the coil 58 is connected to a negative electrode of a DC power supply 60 and a negative DC voltage is supplied to the one end side of the coil 58. A positive electrode of the DC power supply 60 is grounded. With such a construction adopted, the inside of the vacuum chamber 52 is at a potential equal to a positive potential of the DC power supply 60.

The other end side of the coil 58 is in the floating state. The other end side of the coil 58 is not necessarily required to be in the floating state. The other end side of the coil 58 may be connected to the one end side. No specific limitation is imposed on a wire diameter of the coil 58. The diameter is, for example, in the range of 2 mm to 25 mm. No specific limitation is imposed on a spacing between wire turns of the coil 58. The spacing is, for example, in a range of 2 mm to 20 mm. The wire diameter and the spacing between wire turns can be properly determined by experiments or the like.

The DC power supply 60 is preferably of a voltage variable type. A voltage of the DC power supply 60 is in a range of 100 V to 2000 V. A voltage of the DC power supply 60 can be properly determined by experiments or the like.

In the production apparatus 50 with the above construction, a pressure in the vacuum chamber 52 is reduced. Hydrogen gas is introduced through the gas inlet 54 as a plasma generating gas. A negative DC voltage of the DC power supply 60 is applied to the coil 58. Thereby, a plasma 64 is generated in an inner space of the coil 58.

Figure 23A:
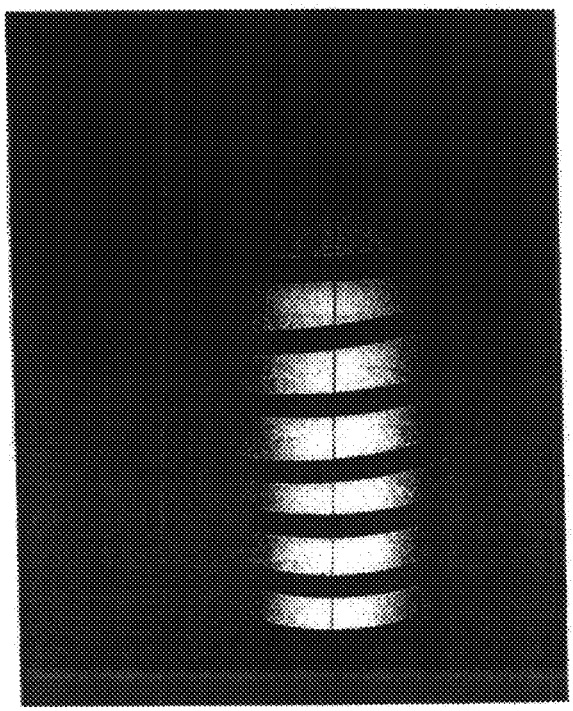
FIG. 23A is a photograph showing a state where a plasma is generated by the production apparatus of FIG. 22.
Figure 23B:
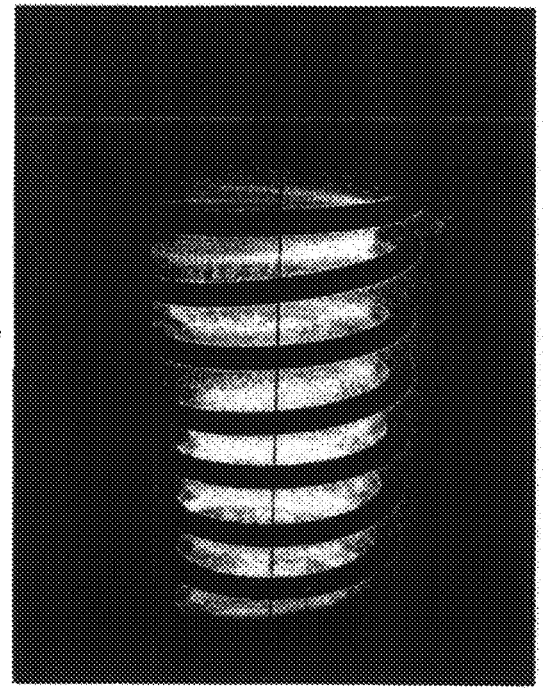
FIG. 23B is a photograph showing a state where a plasma is generated by the production apparatus of FIG. 22.

FIGS. 23A and 23B are photographs showing a state where the plasma 64 is generated in the inner space of the coil 58 by the production apparatus 50 corresponding to the embodiment installed in a laboratory and manufactured by the inventor. Though not indicated with symbols in the photographs, the coil 58, the coil 62 and the plasma 64 are clearly photographed.

Description will be given of a method for producing a carbon film using the production apparatus 50.

A wire 62 is inserted inside the coil 58. An AC power supply 63 is connected to both ends of the wire 62 to heat the wire 62. $H_2$ gas and $CH_4$ gas are introduced through the gas inlet 54. A pressure in the vacuum chamber is reduced and a negative potential of the DC power supply 20 is applied to the coil 58. The plasma 64 is generated in the inner space of the coil 58 by the application. With such a construction adopted, $CH_4$ gas is decomposed to produce a carbon film on the surface of the wire 62.

A state of a carbon film produced by the production apparatus of FIG. 22 is shown in the SEM (Scanning Electron Microscope) image of FIG. 23C. Conditions for production are such that flow rates of $CH_4$ and $H_2$ are 5 ccm and 300 ccm, respectively, a substrate temperature is 750° C., a pressure is 2000 Pa, a DC power is 3000 W, a bias −120 V and a film production time is 15 min.

Figure 23D:
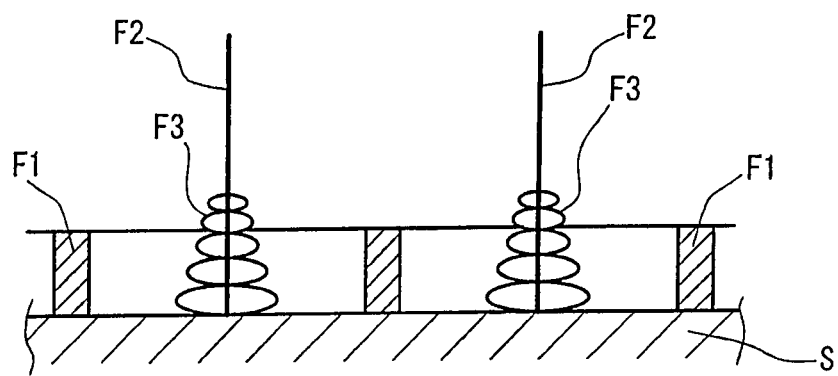
FIG. 23D is a conceptual diagram showing a structure of a carbon film of FIG. 23C.
Figure 23E:
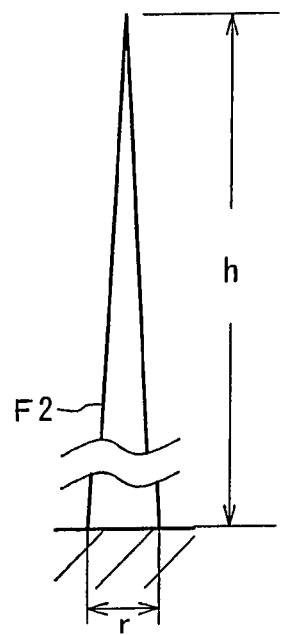
FIG. 23E is a conceptual diagram showing a structure of a needle-like film of FIG. 23D.

Photograph 1 of FIG. 23C is an electron microscope photograph with a magnification of ×1000 at an applied voltage between the anode and the cathode of 3.0 kV. Photograph 2 of FIG. 23C is magnified to ×4300 of Photograph 1. In FIG. 23D, there is conceptually shown a structure of a carbon film shown in the above photographs. In FIG. 23E, there is conceptually shown a needle-like carbon film of FIG. 23D. As shown in FIGS. 23C to 23E, a first film F1 is carbonwalls in the shape of a net. A second film F2 is surrounded with the first film F1. The second film F2 has the distal ends each in the shape of a needle serving as an electron emission point. The second film F2 has distal ends higher than the first film . A third film F3 is produced so as to get entangled with proximal end portions of the second film F2.

The first film F1 is continuously produced on a substrate S and assumes a net-like shape as a whole in a plan view. A height (H) of the first film F1 is around almost 10 nm or less and a width (W) thereof is approximately in a range of 4 nm to 8 nm. The second film F2 is formed with a height (h) higher than a height (H) of the first film F1, for example, around 60 μm. The third film F3 is in the profile of almost a mountain bottom. The profile is, for example, conical. However, the profile is not of a perfect cone, which is expressed so for the sake of easy understanding, and a reality is various kinds of profiles such as a laterally extending base state and a spiral state. In any way, the third film F3 is in contact with the substrate S on a wide area to thereby hold the second film F3 to the substrate S with mechanical rigidity and at the same time, to secure an electric contact with the substrate S.

An electric field is strongly concentrated at the distal ends of the second films F2. No electric field concentration occurs at the first film F1. The distal ends of the second film F2 are spaced at a spacing (D) of a proper value, for example a spacing of the order of 100 μm, from each other by the first film F1 so as not to interfere with each other on electric field concentration actions thereof. A degree of aggregation of the second film F2 is not a densely aggregated state, which conventional carbon nanotubes assume, and an influence by each first film F1 on electric field concentration of the second film F2 is very small.

Description of an action of the carbon film structures.

(1) Since postures of the second film F2 are supported by the third film F3 and are very stable, stable electron emission can be secured.

(2) The second film F2 is of high alignment and good in electron emission characteristic. Hence, in a field emission lamp, a fluorescent substance can be uniformly excited and emits light with uniformity. Therefore, uniform light emission can be realized with a field emission lamp.

(3) The second film F2 is held on the substrate by the third film F3 so rigidly that a highly stable electron emission source can be provided to a field emission lamp even with a high aspect.

(4) Even if a diameter of the second film F2 is small, a good electric contact with a substrate for supplying a current can be assured by the third film F3.

(5) Since a spacing of the second film F2 is restricted by the first film F1, aggregation of the second film F2 can be limited. Hence, the second film F2 can exert a high electric field concentration performance.

In the second film F2, an electric field concentration coefficient β of the Fowler-Nordheim equation is, when a radius at an arbitrary position (a proximal portion in the embodiment) is indicted with r and a height from the position to the distal end is indicated with h, expressed by a relation of h/r. A radius of the second film F2 is tapered so as to be smaller toward the distal end from the arbitrary position. The above description of the tapering includes a case where even if a radius is locally larger between the arbitrary position and the distal end, a radius is globally tapered to be smaller toward the distal end. No limitation is necessarily placed on a case where an intermediate part between the arbitrary position and the distal end is straight. The intermediate part may be not straight and of deformed profiles such as a curved line, bent lines or the like, and the profile may be globally tapered so that a radius is smaller toward the distal end. In the above description, the arbitrary position is not limited to the proximal end portion and may be a position in the intermediate part.

The second film F2 with the construction conducts an electric field emission at the distal end portion with the minimum radius as the maximum electric field concentration portion when an applied voltage is low. If the electric field emission at the portion is saturated, an electric field emission site gradually spreads to a portion with a larger radius while electric field emission is sustained at the distal end portion.

Hence, if an applied voltage is raised, electric field emission is sustained at other portions even after saturation of electric field emission at the distal end portion. As a result, electric field emission enhances in company with increase in applied voltage. Thereby, obtained is a carbon film on which electron emission is hard to be saturated.

The Fowler-Nordheim equation is an equation in electric filed emission expressing a current density emitted in vacuum. The equation is expressed as follows:

$$I=sAF^2/\phi \exp(-B^{3/2}/F)$$

$$F=\alpha V$$

Figure 24:
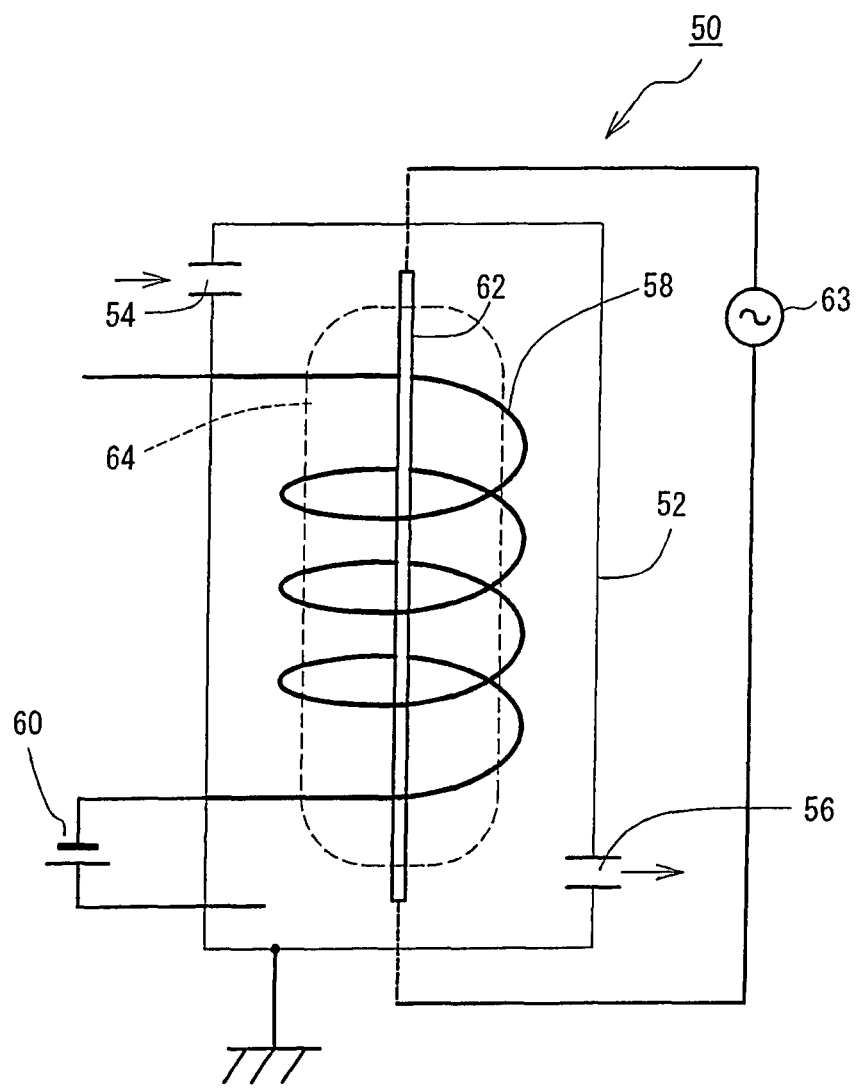
FIG. 24 is a schematic diagram of a production apparatus related to still another embodiment of the present invention.
Figure 25:
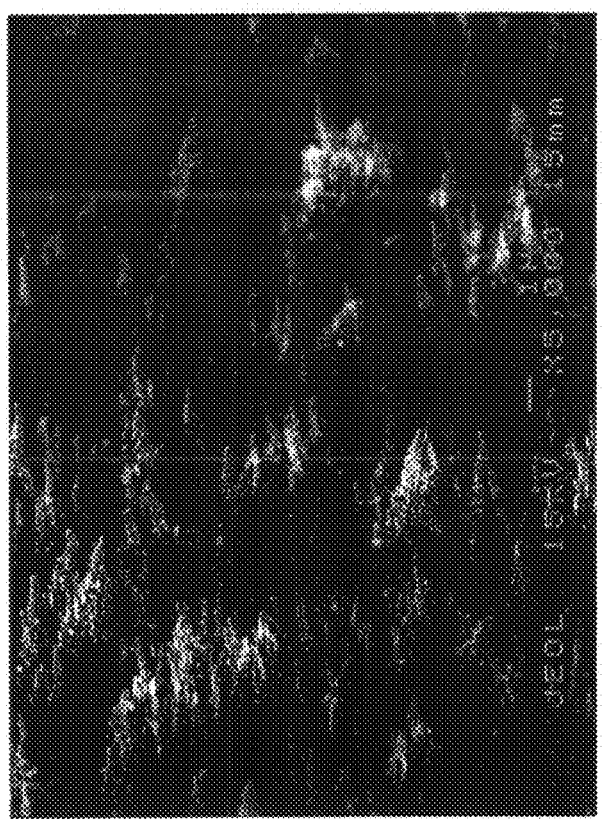
FIG. 25 is a photograph showing a carbon metal nanotree.
Figure 26:
FIG. 26 is a photograph showing another carbon metal nanotree.

In the equations, I indicates an electric field emission current, s indicates a electric field emission area, A indicates a constant, F indicates an electric filed intensity, $\phi$ indicates a work function, B indicates a constant, $\beta$ indicates an electric filed concentration coefficient and V is an applied voltage. The electric field concentration coefficient $\beta$ is a coefficient with which an applied voltage V is converted to a electric field intensity (V/cm) depending on a shape of a distal end and a geometrical shape of a device FIG. 24 shows the construction of another production apparatus 50. A positive electrode of a DC power supply 60 in the production apparatus 50 is placed inside a vacuum chamber 52. In the production apparatus 50 as well, the plasma 64 is generated in the inner space of the coil 58.

(Still Another Embodiment)

The embodiment relates to a new carbon film structure (can be named as carbon metal nanotree).

A carbon nanotube has a structure of a pole-like shape with a high aspect ratio.

A carbon nanotube is easy to cause electric field concentration under a low electric field because of a needle-like shape of the distal end.

A carbon nanotube is used as an electron emission source of an electric field emission type.

A carbon nanotube as the electron emission source is disposed on the cathode side. An anode attached with a fluorescent substance is disposed opposite the cathode. A voltage is applied between the anode and the cathode. With such a construction adopted, an electric field is concentrated at the distal end of a carbon nanotube. Thereby, electrons are emitted from the distal end of a carbon nanotube.

Emitted electrons collide with the fluorescent substance to thereby excite the substance to emit light therefrom. In this case, the fluorescent substance is excited only in a small area (a light emitting point) by collision with the electron and emits light therefrom. Therefore, the distal ends of nanotubes are necessary to be aggregated at a high density in order to improve the density of light emission points, in other words, in order to realize high brightness light emission.

In a case of a carbon nanotube, electric field concentration is hard to occur if the distal ends are aggregated at a high density due to a high aspect ratio thereof.

Since a carbon nanotube is of a high aspect ratio, a resistance value is high, Hence, a current quantity is short and a electron emission performance is easy to be affected. Therefore, a high consumed current is required in order to maintain a high electron emission performance.

The embodiment provides a carbon film structure (carbon metal tree) having advantages such as high density electron emission points, a high aspect ratio, a high conductivity and a low consumed current.

The carbon film structure is constituted of tow parts, one of which is a carbon nanotube extending like a tree trunk (a trunk carbon nanotube) and the other of which are many carbon nonotubes (branch nanotube) like tree branches branched from the trunk-like nanotube in high alignment.

A metal exists at some points on the inside or outside surfaces of the carbon nanotubes, which constitutes a tree as a whole.

Branch carbon nanotubes provide electron emission points at each of which electric field concentration is easy to occur.

Therefore, the above carbon film structure can constitutes a cold cathode electron source capable of emitting electrons with a high efficiency. In addition, a metal is contained in the space inside of a carbon nanotube to thereby improve an electric conductivity. Thereby, an current supply performance is improved to enhance an electron emission performance.

The included metal can be one or more kinds of magnetic metals selected from the group consisting of iron, nickel and cobalt, which are metal catalyst for growth of a carbon nanotube, and alloys thereof. Therefore, the carbon structure can be applied to a magnetic recording material, a sliding material, wear resistant material, a semiconductor material and the like.

Conventionally, a practical method for incorporating a metal into a carbon tube has not been found. For example, there has been used a method in which arc discharge is conducted between carbon electrodes into which a metal catalyst has been kneaded and carbon nanotubes are isolated from produced carbon soot. The isolation method gives a small quantity of included metal. In a nother conventional method, an opening is formed at the distal end of a nanotube and a molten metal is injected through the opening. The injection method gives a small quantity of included metal.

A carbon film structure of the embodiment includes much of a metal. A metal on a nanoscale is stably held therein. The structure can be expected to be used in applications of many industrial fields by exerting a conductivity or a magnetic characteristic. For example, there will be application to a storage medium such as a magnetic disc.

A carbon film structure of the embodiment is of a structure that branch nanotubes are highly aligned with each trunk carbon nanotube. Therefore, since a metal included in trunk carbon tubes is also in high alignment, a magnetic characteristic is excellent in stability.

A carbon film structure of the embodiment can be applied to a cold cathode electron source with a high light emission point density and a high electron emission performance. In addition, since a metal is included, the carbon film structure can be applied to a magnetic recording material, a sliding material, wear resistant material, a semiconductor material and the like.

Description will be given of an example manufacture of the carbon metal nanotree.

A metal coil including a catalyst metal for growth of a carbon nanotube is placed in a vacuum chamber. The metal coil may be either a single turn or plural turns. A metal wire with a high resistivity is disposed in the metal coil. A pressure in the vacuum is reduced and then a mixed gas of hydrogen gas and carbon containing gas is introduced into the vacuum chamber. A potential of the metal wire is maintained to be negative and the metal wire is heated by supplying a current. A high frequency voltage is applied between both ends of the metal coil to generate the plasma from the mixed gas in the neighborhood of the metal coil. A carbon metal nanotree, which is of a carbon film structure of the embodiment, is produced on the surface the metal wire by the plasma.

The metal coil can be formed only with a catalyst metal. A metal coil can be a metal coil with a catalyst film formed thereon. Catalyst metals are preferably Fe, Ni and Co. Other catalyst metals include: Y, Rh, Pd, Pt, La, Ce, Pr, Nd, Gd, Tb, Dy, Ho, Er and Lu. Materials of a metal coil include: nickel based stainless steel such as 18-8 stainless steel (SUS304); and chromium based stainless steel such as 18 chromium stainless steel (SUS430) and 13 chromium stainless steel (SUS410), all being under nomenclature of JIS.

A nichrome wire can be used as a metal wire. A heating temperature of a metal wire can be approximately in a range of 500° C. to 1000° C. A metal wire can be maintained at a negative potential approximately in a range of −20 V to −400 V.

A pressure in the vacuum chamber can be in a range of 10 Pa to 1000 Pa. A carbon containing gas can be selected from hydrocarbons such as acetylene, ethane and others in addition to a methane gas.

Through the above steps, a plasma space is formed from a mixed gas in the neighborhood of a metal coil and a catalyst metal included in the meal coil is sputtered by the action of the plasma and sputtered metal particles are attached onto the surface of the metal wire. After the catalyst metal is attached on the metal wire, carbon nanotubes start growing on the surface of metal wire by the action of the catalyst metal on the metal wire. During the growth, trunk carbon nanotubes grow and branch carbon nanotubes grow, while branching off in company with the growth of the trunk nanotubes.

On the other hand, a catalyst metal is included in a space inside a carbon nanotube simultaneously with growth of the carbon nanotube. In this case, the metal wire side of a carbon tube is maintained at a negative potential, while a high frequency voltage is applied to the metal coil, and trunk carbon nanotubes are aligned in a direction of an electric field formed by the application of the high frequency voltage, that is in a direction perpendicular to an equipotential surface. In parallel to the growth of the trunk carbon nanotubes, branch carbon nanotubes are aligned in the sane direction. Thereby, obtained is a carbon film structure having a tree structure in which branch carbon nanotubes are branched from plural sites on each of the trunk carbon nanotubes including a metal in high alignment with the trunk carbon nanotube.

The carbon film structure produced through the above production steps are shown in electron microscope photographs from FIGS. 25 to 30. Conditions for the production are such that a pressure in the vacuum chamber is 100 Pa, the metal coil is made of 18-8 stainless steel (SUS304), a metal wire is a nichrome wire, a heating temperature of the nichrome wire raised to 700° C. by supplying a current therein, a negative potential of the nichrome wire is −100 V and the mixed gas includes hydrogen gas and methane gas.

Figure 29:
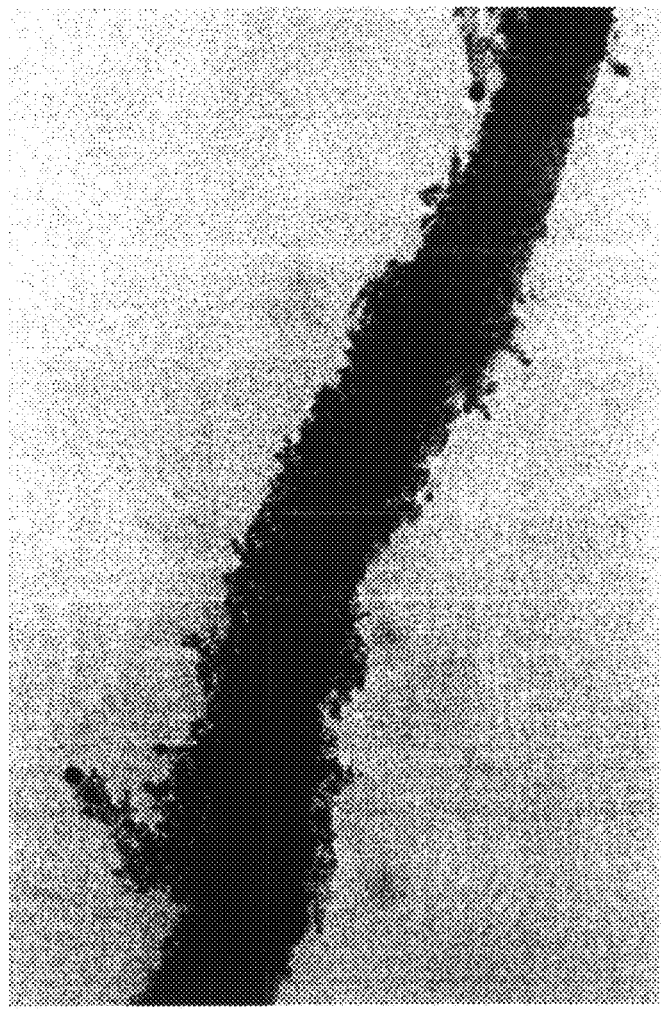
FIG. 29 is a photograph showing still another carbon metal nanotree.

In the photograph with a magnification of ×5000, it is found that many of branch carbon nanotubes are branched off from each trunk carbon nanotube in high alignment. In the photograph with a magnification of ×10000, it is found that many of branch carbon nanotubes are branched off from each trunk carbon nanotube in high alignment. In the photograph of FIG. 27, it is found that as seen by comparison with a scale of 100 nm, many of branch carbon nanotubes are branched off from each trunk carbon nanotube in high alignment. In the photograph of FIG. 28, it is found that as seen by comparison with a scale of 100 nm, many of branch carbon nanotubes are branched off from each trunk carbon nanotube in high alignment. In the photograph of FIG. 29, it is found that many of branch carbon nanotubes are branched off from each trunk carbon nanotube in high alignment. In the photograph of FIG. 30, it is found that many of branch carbon nanotubes are branched off from each trunk carbon nanotube in high alignment. Besides, it is found that a metal is included inside each trunk carbon nanotube.

(Still Another Embodiment)

The surface light source giving illumination with planar extension includes: a right under type and an edge light type. In the right under type, a surface light source is disposed right under a liquid crystal display device. In the edge light type, a light guide plate is disposed right under a liquid crystal display device. A surface light source is disposed in parallel with the end surface of a light guide plate. The edge light type in recent years goes main stream instead of the right under type in a low-profile oriented personal computer and a low-profiled television receiver. In an edge light type, a high brightness is hard to be expected when in an low incidence efficiency of light incident on a light guide plate. In a right under type, since light can be launched directly to a liquid crystal display device, a light incidence efficiency is very high.

Such a right under type surface light source includes: an anode having a fluorescent substance formed thereon placed between a rear panel and a front panel in a vacuum sealed inside; and a field emission lamp having an electron emission cathode disposed opposite the anode.

In the field emission lamp, a structure thereof is such that the front panel side is attached onto the rear surface of a liquid crystal display device and light emission inside the lamp is directed to a liquid crystal display device with a front panel interposed therebetween. The front panel is made of a transparent member such as glass in order to enhance an incidence efficiency of light to the liquid crystal display device.

In the field emission lamp, the front panel thereof is thermally expanded because of heat generation by light emitted by a fluorescent substance. In this case, the front panel is made of glass. The anode section is made of a metal material. Hence, there arises a difference in thermal expansion between the front panel and the anode section. By the difference in thermal expansion, a thermal stress occurs in the front panel. Such a thermal stress deforms the front panel under simultaneous influences of factors of repetition of light emission and non-light emission of the surface light source, a vacuum in the interior and the thin front panel. Deformation of the front panel has a possibility to cause reduction of uniformity of brightness and breakage in an extreme case thereof In the embodiment, deformation of a front panel and breakage thereof are effectively prevented. In the embodiment, a thermal stress relaxing material alleviating a thermal stress generated in the front panel is provided between the front panel and the anode. A relaxation material in a layered structure is preferably used as a thermal stress relaxing material. For example, mica is used as the relaxation material. The layered structure can relax a thermal stress generated therein because of its layered structure when a thermal stress in the front panel and a thermal stress in the anode section are directed in opposed directions on a plane so as to result in a tension. Examples of the mica include: soda mica, red mica, white mica, black mica, gold mica, iron mica, all as natural mica, while since the natural mica loses an OH group together with water loss by heating, preferable is an artificial mica in which OH groups are replaced with F.

A thermal stress relaxing material absorbs a difference in thermal expansion or contraction between a front panel and an anode section. As a result, even if light emission and non-light emission are repeated, or even if the inside is in a vacuum and a front panel is thin, deformation by a thermal stress is prevented.

The anode section can be provided in a state where not only is the section supported by a heat resistant support member, but the heat resistant support member can be movable relative to a side panel. Used as heat resistant support members are quartz glass, Tenpax panel, Vycol glass, Neocerum glass, Pylex glass (registered trace mark) and others. The kinds of glass are excellent in strength, to be more detailed high in durability when in rapid cooling or heating and high in impact resistance in common with each other. In a structure in which the anode section is supported with a support member, the front panel receives no thermal stress in combination with the anode section due to a difference in thermal expansion or contraction. As a result, the front panel is, similar to the above case, prevented from being deformed by a thermal stress.

Detailed description will be given of a field emission lamp related to the embodiment with reference to the accompanying drawings.

Description will be given of a field emission lamp related to the embodiment with reference to FIGS. 31 to 34. A field emission lamp 70 includes a rear panel 72, a front panel 74 facing the rear panel 72, side panels 76 elected vertically from the periphery of the rear panel 72, and a panel case including a vacuum sealed space.

The rear panel 72 forms a shallow recess in the inside surrounded with the side panel 76 and the recess is sealed in an air-tight manner with the front panel 74.

Figure 31:
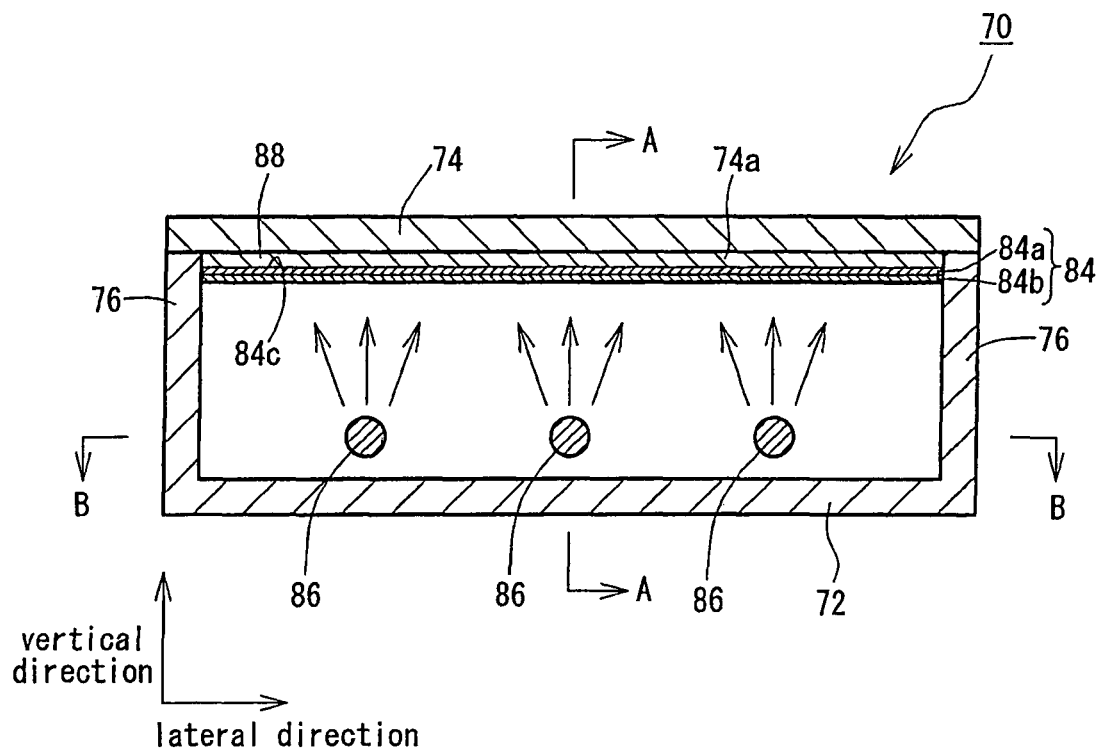
FIG. 31 is a sectional view of a field emission lamp.
Figure 32:
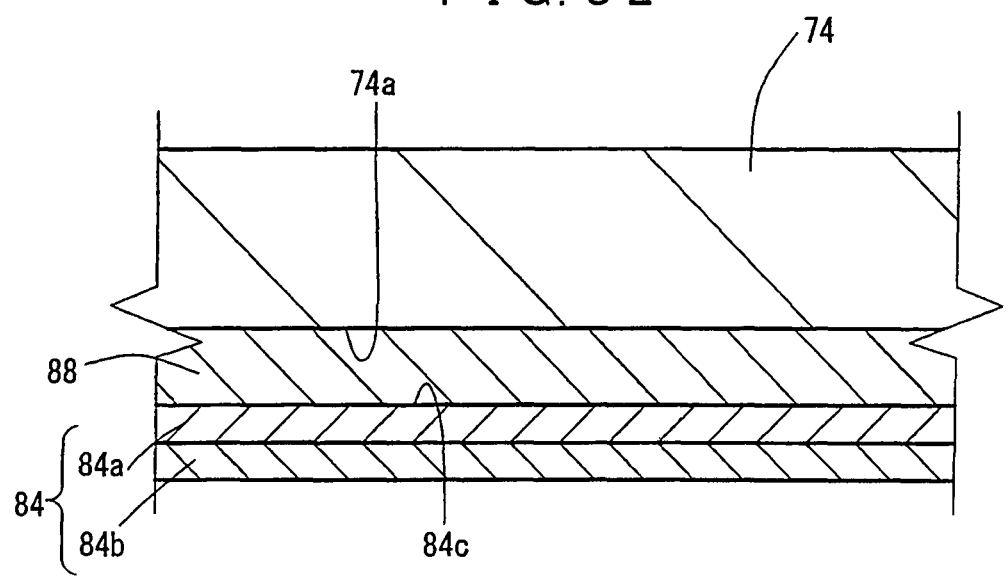
FIG. 32 is an enlarged view of a main part of FIG. 31.
Figure 34:
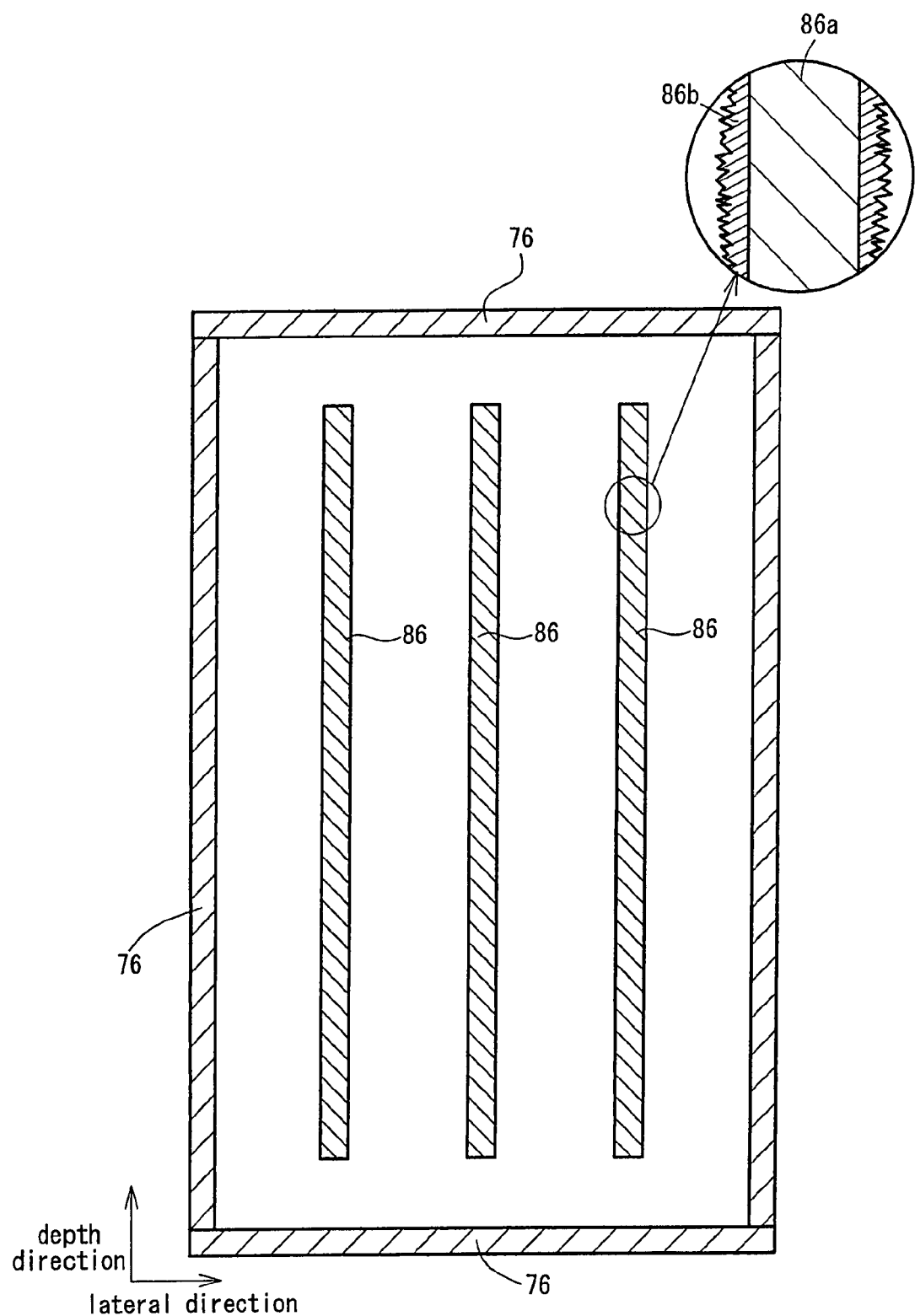
FIG. 34 is a sectional view taken on line B-B of FIG. 31.

Note that, directions along which constituents extend are described, for convenience in description, in FIGS. 31 and 32. A vertical direction is a direction from top to bottom in FIG. 31 in viewing direction, and a direction orthogonally passing through the surface of the sheet of FIG. 32.

A direction, from left to right, perpendicular to the vertical direction on the sheet of FIGS. 31 and 32 is referred to as a lateral direction (a direction in a plane).

A direction vertically passing through the surface of the sheet of FIG. 31 and a direction, from above to below, of FIG. 32 are referred to as a depth direction (another direction in the plane) between opposed surfaces of the rear panel 72 and the front panel 74.

If a size in the vertical direction is short, a surface light source is of a low profile and if a plane size is large, a light emission area of the surface light source is of a large size.

The rear panel 72 and the side panel 76 are molded with an insulating material such as a resin. A light reflection treatment is applied by, preferably, aluminum evaporation deposition on the inner surfaces of the rear panel 72 and the side panel 76.

The front panel 74 is molded with a light transmissive insulating material such as glass and resin, transparent or translucent.

In the panel case, plural electron emission sections 86 are arranged in a lateral direction with an equal spacing on the inner surface of the rear panel 72.

Each electron emission section 86 is constituted of a conductive wire 86a extending long in the depth direction; and a carbon film 86b such as a carbon nanotubes, carbon nanowalls or the like provided on the outer surface of the conductive wire 86a.

The anode section 84 emitting light under irradiation with electrons emitted from the electron emission section 86 is provided on the inner surface side of the front panel 74.

The anode section 84 is constituted of a light transmissive anode 84a such as a transparent electrode made of an ITO film or an evaporation deposited aluminum film; and a fluorescent substance 84b on the anode 84a.

In the field emission lamp 70 with the above construction, a thermal stress relaxing material 88 relaxing a thermal stress generated in the front panel 74 caused by a difference in thermal expansion or contraction between the front panel 74 and the anode section 84 is provided between the inner surface 74a of the front panel 74 and the outer surface 84c of the anode section 84.

A member of a layered structure, for example mica, can be preferably used as the thermal stress relaxing material 88. The thermal stress relaxing material 88 is used since the front panel 74 is made of glass and the anode 84a of the anode section 84 is made of a metal and there is a difference in thermal expansion and contraction between both.

Since the anode 84a is made of a metal, a quantity of thermal expansion or contraction is small even if the anode 84a is heated by light emitted from the fluorescent substance 84a, which raises a temperature thereof.

On the other hand, the front panel 74 is made of glass, a quantity of thermal expansion or contraction is large in comparison with the anode 84a, and heat is accumulated therein; therefore, a thermal stress is easy to remain.

Since the thermal stress relaxing material 88 relaxing a thermal stress is interposed between such the anode 84a and the front panel 74, the front panel 74 is not affected by a difference in thermal expansion or contraction between the front panel 74 and the anode 84a even if the front panel 74 is heated by light emitted from the fluorescent substance 84a. A thermal stress is hard to remain. As a result, the front panel 74 can be prevented from being deformed.

In the field emission lamp 70, the front panel 74 can be prevented from being deformed by a thermal stress even if light emission or non-light emission of the fluorescent substance 84b are repeated, or even if the inside is vacuum and the front panel 74 is constituted of a thin glass plate.

From the above description, a field emission lamp of the embodiment can be used as a backlight excellent in durability even if the lamp is of a larger-size and of a lower profile.

Figure 35:
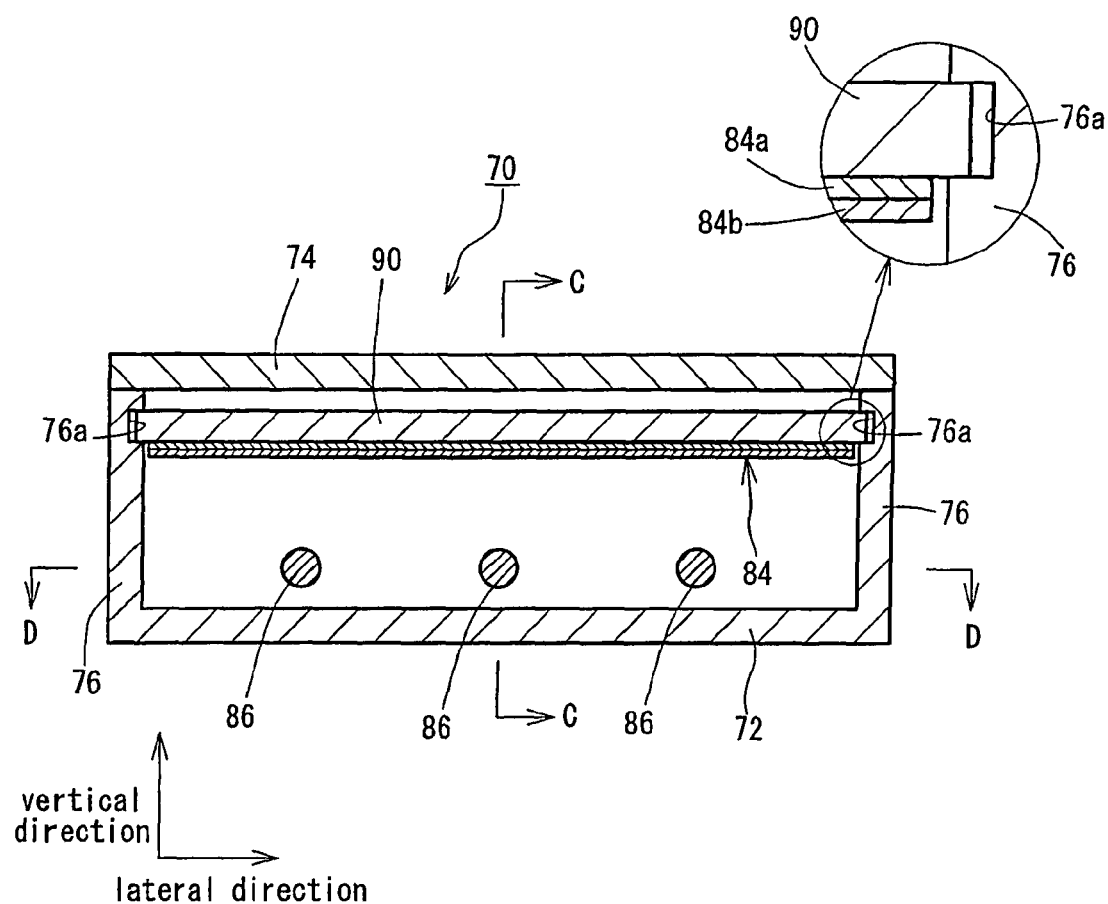
FIG. 35 is a sectional view of another field emission lamp.
Figure 36:
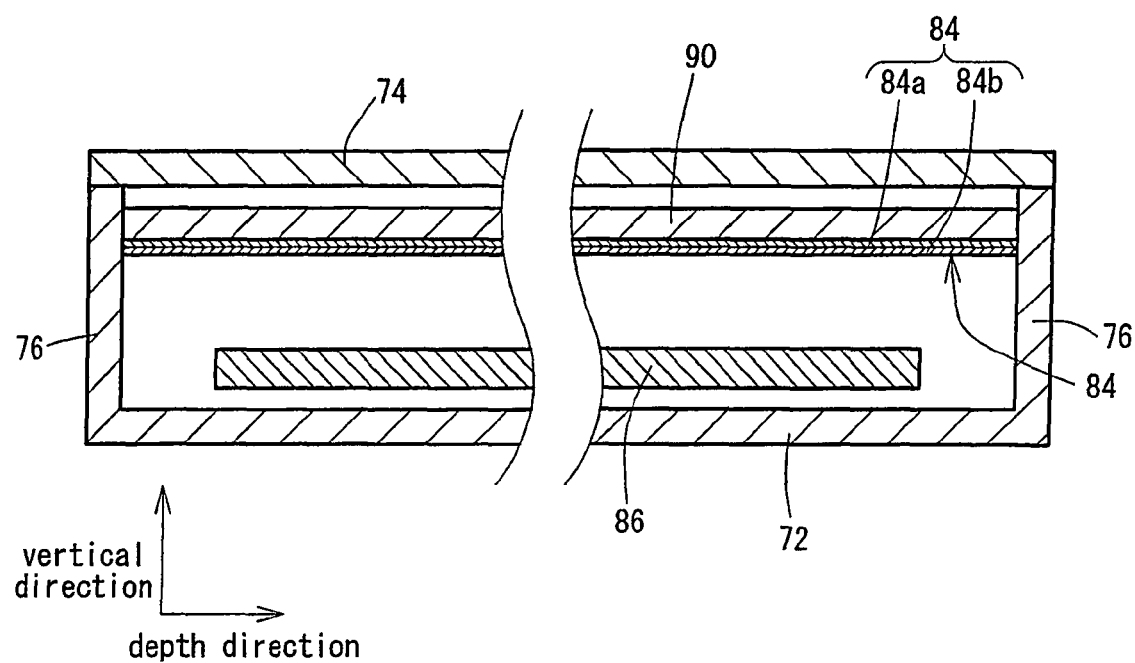
FIG. 36 is a sectional view taken on line C-C of FIG. 35.
Figure 37:
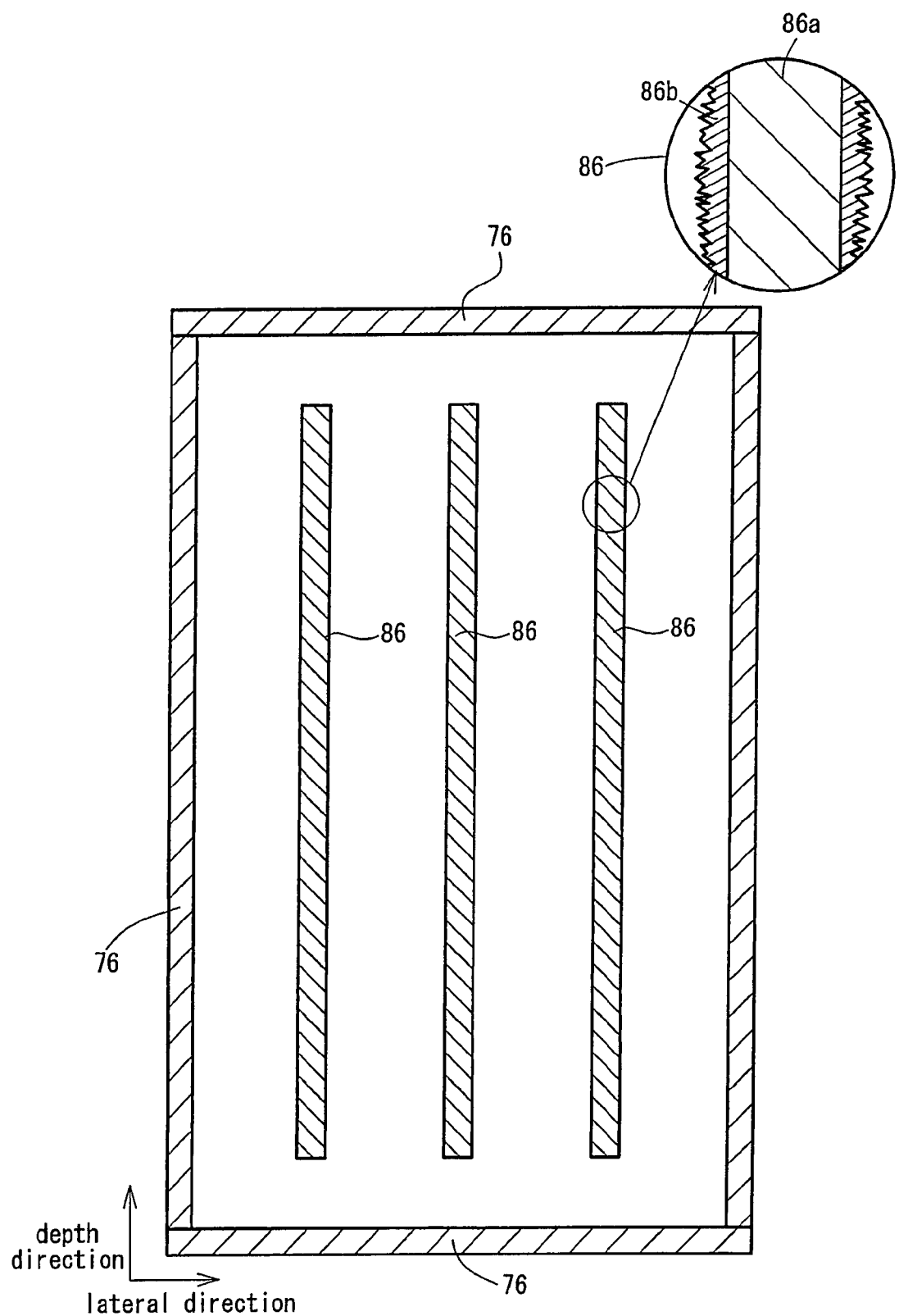
FIG. 37 is a sectional view taken on line D-D of FIG. 35.

Description will be given of another field emission lamp with reference to FIGS. 35 to 37, In a field emission lamp 70, not only is an anode section 84 supported by a heat resistant support member 90, but both ends of the support member 90 are also placed in recess support sections 76a on the inner surface of the side panel 76 with a small clearance interposed therebetween. The support member 90 can be made of a heat resistant material such as quarts.

According to the field emission lamp 70, since the anode section 84 is supported by the support member 90 and the support member 90 is placed in the support sections 76a in a movable manner relative to the side panel 76. The front panel 72 is not affected by a thermal stress between the front panel 72 and the anode section 84 even if there is a difference in thermal expansion or contraction between the front panel 72 and the anode section 84.

As a result, the front panel can be prevented from being deformed by a thermal stress even if light emission and non-light emission of the fluorescent substance 84b are repeated, or the inside is in a vacuum and the front panel 72 is thin.

Note that as shown in FIG. 38, a pair of protrusions 76b and 76b, in a direction perpendicular to the side panel 76, from the inner surface of the side panel 76 are provided and both ends of the support member 90 are placed in the recesses 76c each between the both protrusions 76b and 76b. A single protrusion 76b, instead of the pair of protrusions 76b and 76b, may be adopted and both ends of the support member 90 may be simply placed on the protrusions 76b.

Figure 39:
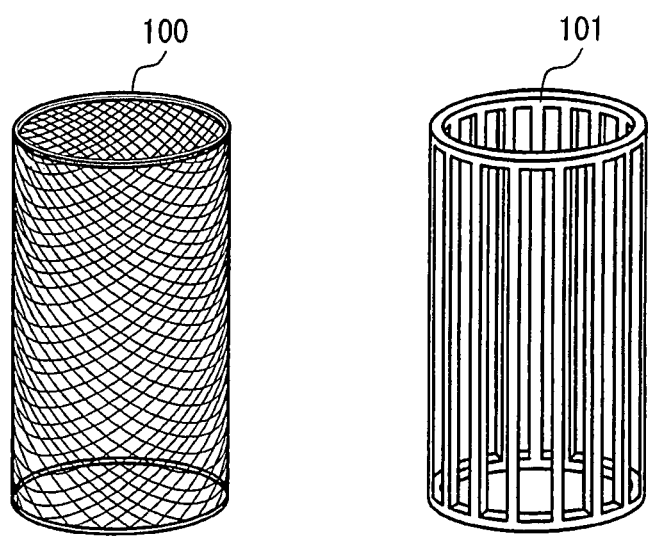
FIG. 39 is a view showing another example of the cylindrical member.

In FIG. 39, there is shown another example modification of the cylindrical member. A cylindrical member placed in a vacuum chamber has only to have an opening at one end side, both end sides or a position on the circumferential wall.

A cylindrical member may be, in addition to a coil having a circumferential wall in the shape of a spiral, a cylindrical member 100 having a circumferential wall in the shape of net or a cylindrical member 101 having a circumferential wall in the shape of slits. Shapes of other openings may be arbitrary. A cylindrical member is not limited to a circle in section and may be a rectangle in section.

Figure 40:
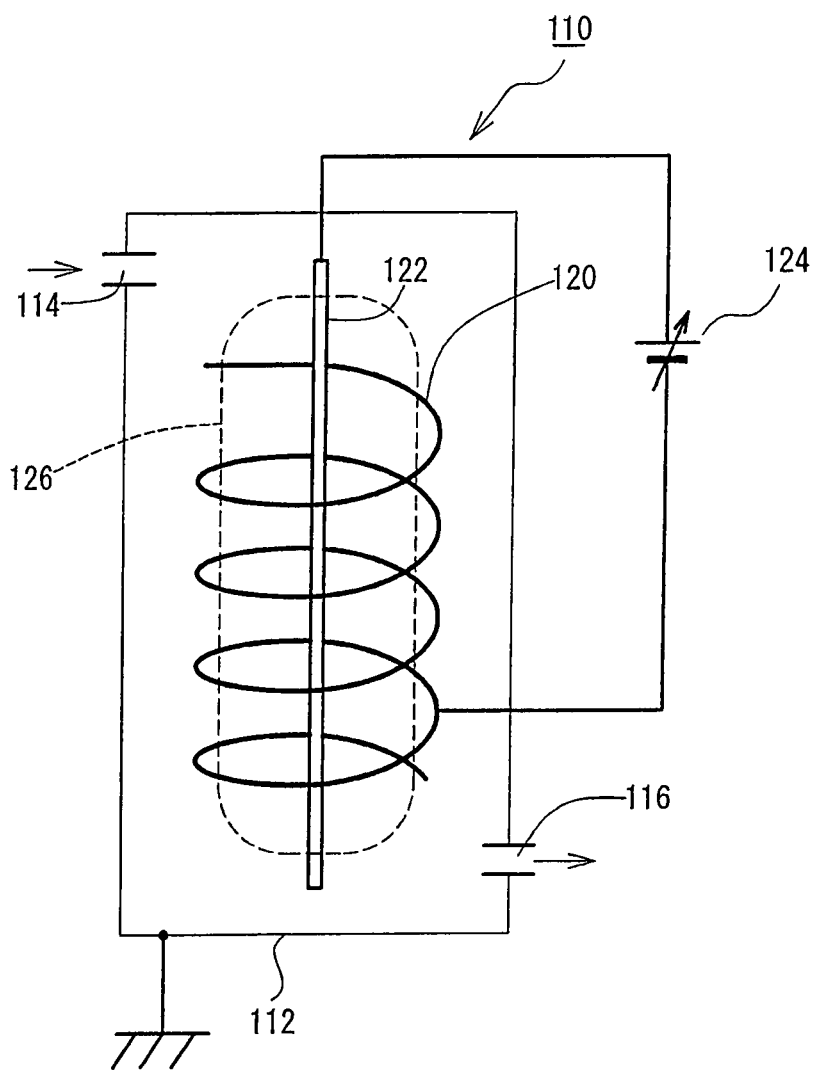
FIG. 40 is a schematic diagram of another example apparatus for producing a carbon film.

In FIG. 40, there is shown another modification of the production apparatus. A vacuum chamber 112 has a gas inlet 114 and a gas outlet 116. A pressure in the vacuum chamber 112 is in a range of 10 Pa to 10000 Pa. A coil 120, which is a cylindrical member, is placed inside the vacuum chamber 112. A conductive wire 122 is disposed in an inner space of the coil 120. The coil 120 extends in one direction. The inner space of the coil 120 is a space for generating a plasma in the shape of a cylinder extending long in one direction. The thin wire 122 is disposed in this inner space and extends long. The coil 122 and the conductive wire 122 faces each other with a desired spacing interposed therebetween along the extending direction. One end side of the coil 120 is connected to a negative electrode of a voltage variable type DC power supply 124. The wire 122 is connected to a positive electrode of the DC power supply.124.

In a production apparatus 110 with the above construction, a pressure in the vacuum chamber 112 is reduced and hydrogen gas as a plasma generating gas is introduced through the gas inlet 114 and when a negative potential of the DC power source 124 is applied to the cylindrical member 120, a plasma 126 is generated in the inner space of the cylindrical member 120.

Description will be given of production of a carbon film. The wire 122 is disposed in the coil 120. Both ends of the wire 122 may also be connected to an AC power source 123 to thereby heat the wire 122. Hydrogen gas as a plasma generating gas and, for example, methane gas as a carbon containing gas for producing a carbon film on the surface of the wire 122 are introduced through the gas inlet 114. Then, a pressure in the vacuum chamber 112 is reduced. A negative potential of the DC power source 124 is applied to the coil 120 and a positive potential thereof is applied to the wire 122. Thereby, the plasma 126 is generated in the inner space of the coil 120. Methane gas is decomposed by the plasma 126, thereby producing a carbon film on the surface of the wire 122.

In the above case, if the coil 120 is a solid carbon source, hydrogen ions in the hydrogen a plasma collide with the coil 120, which is a solid carbon source, and to which a negative DC voltage is applied, at a high speed and carbons are caused to flies out from the coil 120 by the collision energy. The fly-out carbons each form a chemical bond (CxHy) with a hydrogen ion into a hydrocarbon compound to then collide with the wire 122. Hydrogen flies out from the hydrocarbon compound having collided with the wire 122 and carbon stays on the surface of the wire 122 accumulates thereon. As a result, a carbon film is produced on the surface of the wire 122.

Figure 41:
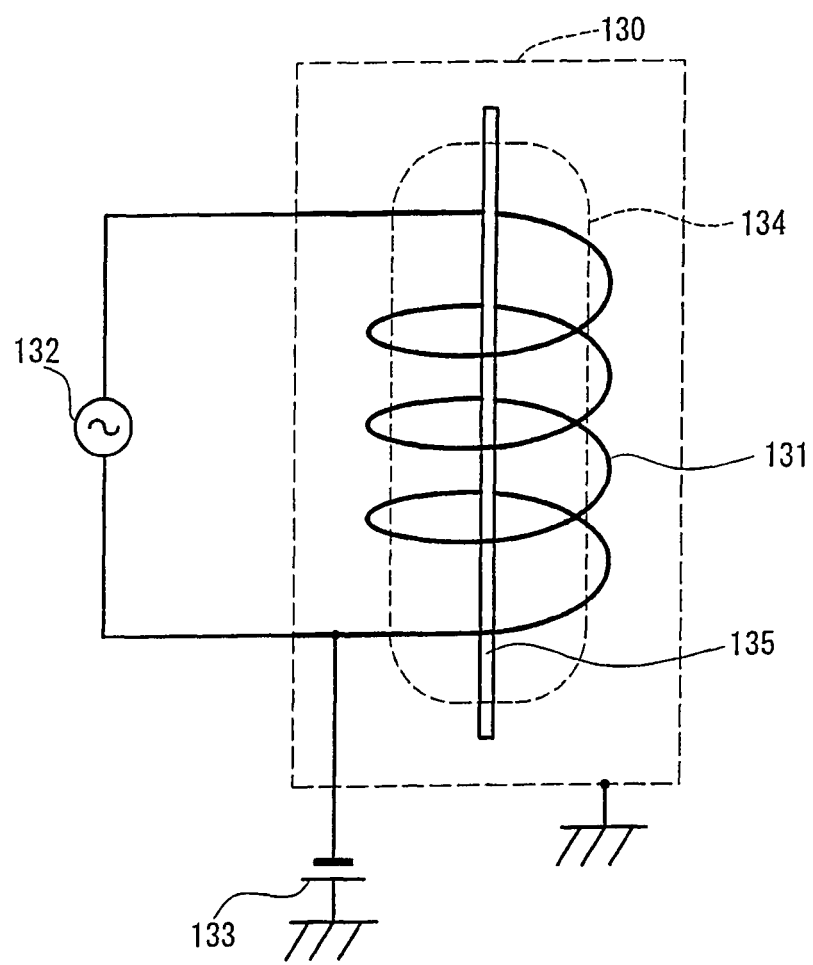
FIG. 41 is a schematic diagram of another example apparatus for producing a carbon film.

FIG. 41 is another construction diagram of a production apparatus for a carbon film. The production apparatus is equipped with a vacuum chamber 130 at a gas pressure in a range of 0.1 to 50 Torr.

A coil 131 is disposed as a cylindrical member in the vacuum chamber 130.

Hydrogen gas and a carbon containing gas are introduced as a material gas for producing a carbon film into the vacuum chamber 130.

A high frequency power supply 132 and a DC power supply 133 are applied to the coil 131 as a voltage for generating a plasma in a cylindrical member 131.

A high frequency power supply 132 is connected to both ends of the coil 131 and the DC power supply 133 is connected to one end side of the coil 131.

A high frequency voltage is applied across both ends of the coil 131.

A negative DC voltage is applied to one end side of the coil 131.

Thereby, A voltage obtained by superimposing a high frequency voltage on a negative DC voltage is applied to the coil 131. With application of the voltage, a plasma 134 is generated in an inner space of the coil 131. A preferable carbon film is produced on the surface of the wire 135, which is a substrate disposed in the cylindrical member 131, by the plasma 134. Note that the coil 131 may be replaced with a cylindrical member having at least one opening in at least one part thereof.

In a case of the superimposition as well, conditions for producing a carbon film as shown in FIGS. 23C to 23E were such that flow rates of $CH_4$ and $H_2$ are 5 ccm and 300 ccm, respectively, substrate temperature is 750° C., a pressure is 2000 Pa, a DC power is 3000 W, a high frequency power is 500 W, a bias is −120 V and a film production time is 10 min.

The method for producing a carbon film according to the present invention is useful for production of a carbon film used in electron emission in a field emission lamp, a electron source or the like.

What is claimed is:

1. An apparatus for producing a carbon film with a nanostructure on a surface of a substrate using plasma chemical vapor deposition, the apparatus comprising:
    a vacuum chamber into which a gas for carbon film production is introduced;
    a cylindrical member that is disposed in the vacuum chamber, has an opening in part thereof, and is configured so as to allow the disposing of a substrate therein, the substrate being not grounded and
    a power source having a DC power source which generates a negative DC voltage, and having a high-frequency power source which generates a high-frequency voltage,
    wherein the gas is introduced into the vacuum chamber and a voltage for generating a plasma is applied to the cylindrical member to thereby generate the plasma in the cylindrical member and to produce a carbon film on the surface of the substrate disposed in the cylindrical member,
    the cylindrical member is a coil having a first end and a second end, said first end of said cylindrical member is connected to a negative electrode of the DC power source, and said second end of said cylindrical member is in a floating state,
    said high-frequency power source is coupled to said cylindrical member so as to superimpose the high-frequency voltage on the negative DC voltage, and
    diameters of turns of the coil in a middle portion of the coil in a length-wise direction of the coil are larger than diameters of turns of the coil at both end portions of the coil.

2. The apparatus according to claim 1, wherein the substrate is a wire extending in the length-wise direction and
    the cylindrical member extends in the direction in which the wire extends.

3. The apparatus according to claim 2, wherein the wire is a wire serving as a cathode facing an anode in a vacuum sealed tube.

4. The apparatus according to claim 1, wherein plural cylindrical members are disposed together in the length-wise direction.

5. The apparatus according to claim 1, further comprising: a power supply supplying a current into the substrate to thereby heat the substrate.

6. The apparatus according to claim 1, wherein the cylindrical member can be extended in the length-wise direction.

7. A method for producing carbon metal nanotrees on a surface of a substrate using an apparatus according claim 1, comprising:
- a step of disposing the cylindrical member including a catalyst metal in a vacuum chamber;
- a step of disposing a high resistivity metal material inside the cylindrical member;
- a step of reducing a pressure in the vacuum chamber;
- a step of introducing a mixed gas of hydrogen gas and a carbon containing gas as a gas for carbon film production into the vacuum chamber; and
- a step of applying a high frequency voltage as a voltage to the cylindrical member to thereby excite the introduced mixed gas into a plasma and not only to sputter the cylindrical member but also to supply a current into the high resistivity metal material to thereby heat the material while the material is maintained at a negative potential.

8. The method according to claim 7, wherein the cylinder is a metal coil.

9. A method for producing a carbon film on a surface of a substrate using an apparatus according to claim 1, comprising:
- a step of disposing the cylindrical member in the vacuum chamber;
- a step of disposing the substrate inside the cylindrical member;
- a step of introducing the gas into the vacuum chamber; and
- a step of applying the voltage to the cylindrical member.

10. The method according to claim 9, wherein the voltage is a high frequency voltage.

11. The method according to claim 9, wherein a DC voltage is applied to the substrate.

12. The method according to claim 9, wherein the voltage is a negative DC voltage.

13. The method according to claim 9, wherein the voltage is a voltage obtained by superimposing a high frequency voltage on a negative DC voltage.

14. The method according to claim 9, wherein the cylindrical member has an opening or openings at one end side or both end sides of a cylindrical member, or an opening on the circumferential wall.

15. The method according to claim 9, wherein the cylindrical member is extended according to a length of the substrate.

16. A carbon film produced with a method according to claim 9 constituted of many carbon nanotube bundles, wherein the carbon nanotube bundles are constructed such that carbon nanotubes constituting the carbon nanotube bundle are aggregated at the proximal end side thereof and arranged apart from one another at a spacing at the distal end side thereof so as to be useful for electric field concentration.

17. A wire on the surface of which a carbon film, for electron emission, is produced with a method according to claim 9, and serving as a cathode facing an anode in a vacuum sealed tube.

18. A field emission lamp comprising: a panel case; an anode provided on the inner surface of the panel case and to which a fluorescent substance is attached; and a wire cathode disposed so as to face the anode to which a fluorescent substance is attached in the panel case, wherein the wire cathode is constituted of a wire on the surface of which a carbon film for an electron emission is produced with a method according to claim 9.

* * * * *

UNITED STATES PATENT AND TRADEMARK OFFICE
CERTIFICATE OF CORRECTION

| | | |
|---|---|---|
| PATENT NO. | : 8,808,856 B2 | Page 1 of 1 |
| APPLICATION NO. | : 10/558874 | |
| DATED | : August 19, 2014 | |
| INVENTOR(S) | : Masanori Haba | |

It is certified that error appears in the above-identified patent and that said Letters Patent is hereby corrected as shown below:

ON THE TITLE PAGE

Please insert:

item --(30) Foreign Application Priority Data

| | | |
|---|---|---|
| Jan. 5, 2005 | (JP) .............................. | 2005-000800 |
| Jan. 5, 2005 | (JP) .............................. | 2005-000803 |
| Mar. 25, 2005 | (JP) .............................. | 2005-088813 |
| Apr. 13, 2005 | (JP) .............................. | 2005-115558 |
| Apr. 13, 2005 | (JP) .............................. | 2005-115560--. |

Signed and Sealed this
Twenty-fifth Day of August, 2015

Michelle K. Lee
*Director of the United States Patent and Trademark Office*